United States Patent
Peng et al.

(10) Patent No.: US 11,302,240 B2
(45) Date of Patent: Apr. 12, 2022

(54) PIXEL BLOCK-BASED DISPLAY DATA PROCESSING AND TRANSMISSION

(71) Applicant: SHANGHAI YUNYINGGU TECHNOLOGY CO., LTD., Shanghai (CN)

(72) Inventors: Yu-Hsun Peng, Hsinchu (TW); Chun-Ta Wu, Hsinchu (TW); Chia-Sheng Liu, Taipei (TW); Yu-Hsing Chuang, Taipei (TW); Jing Gu, Shanghai (CN)

(73) Assignee: KUNSHAN YUNYINGGU ELECTRONIC TECHNOLOGY CO., LTD, Kunshan (CN)

( * ) Notice: Subject to any disclaimer, the term of this patent is extended or adjusted under 35 U.S.C. 154(b) by 0 days.

(21) Appl. No.: 16/264,617

(22) Filed: Jan. 31, 2019

(65) Prior Publication Data

US 2020/0251041 A1    Aug. 6, 2020

(51) Int. Cl.
*G09G 3/20* (2006.01)
*H01L 27/12* (2006.01)
(Continued)

(52) U.S. Cl.
CPC ....... *G09G 3/2088* (2013.01); *H01L 27/1214* (2013.01); *H01L 27/326* (2013.01);
(Continued)

(58) Field of Classification Search
CPC .. G09G 3/3614; G09G 3/3648; G09G 3/3685; G09G 3/3696; G09G 3/3688; G09G 3/3607; G09G 3/36; G09G 3/2007; G09G 3/2011; G09G 2300/0491; G09G 2310/0251; G09G 2310/06; G09G 2310/027; G09G 2320/0252;
(Continued)

(56) References Cited

U.S. PATENT DOCUMENTS 7,466,340 B1 * 12/2008 Herz ................. G09G 3/20 348/173
9,881,535 B2 * 1/2018 Hanaoka .............. G09G 3/20
(Continued)

OTHER PUBLICATIONS

Notice of Reason for Refusal issued in corresponding Japanese Application No. 2020-013858, dated Nov. 4, 2020, 5 pages.

*Primary Examiner* — Nitin Patel
*Assistant Examiner* — Amen W Bogale
(74) *Attorney, Agent, or Firm* — Bayes PLLC

(57) ABSTRACT

A system for compensating display data of an image includes a display, a processor, and control logic operatively coupled to the display and the processor. The display has a plurality of pixels. The processor includes a graphics pipeline configured to generate a set of original display data of the image for a plurality of frames. The processor also includes a pre-processing module configured to determine a still portion of the set of original display data, and generate a set of compensation data for the still portion of the set of original display data. The set of compensation data includes a plurality of sub-sets of compensation data for the plurality of frames. The processor also includes a data transmitter configured to transmit, in each one of the plurality of frames, a stream of display data including one of the plurality of sub-sets of the compensation data.

24 Claims, 20 Drawing Sheets

(51) Int. Cl.
*H01L 27/32* (2006.01)
*H03K 19/173* (2006.01)

(52) U.S. Cl.
CPC . *H03K 19/1733* (2013.01); *G09G 2320/0242* (2013.01); *G09G 2360/16* (2013.01)

(58) Field of Classification Search
CPC ... G09G 2320/0233; G09G 2320/0247; G09G 2320/0242; G09G 2320/0276; G09G 2320/0261; G09G 2340/16
See application file for complete search history.

(56) References Cited

U.S. PATENT DOCUMENTS

| | | | |
|---|---|---|---|
| 9,959,589 B2* | 5/2018 | Bae | G06T 1/20 |
| 2007/0290964 A1* | 12/2007 | Yang | G09G 3/3648 |
| | | | 345/87 |
| 2011/0216043 A1* | 9/2011 | Tamura | G02F 1/13318 |
| | | | 345/175 |
| 2013/0027437 A1* | 1/2013 | Gu | G02F 1/134336 |
| | | | 345/690 |
| 2014/0049566 A1* | 2/2014 | Sudou | G09G 5/38 |
| | | | 345/681 |
| 2016/0035260 A1* | 2/2016 | Kim | G09G 3/3614 |
| | | | 345/212 |
| 2020/0168183 A1* | 5/2020 | Kim | G06T 5/003 |

* cited by examiner

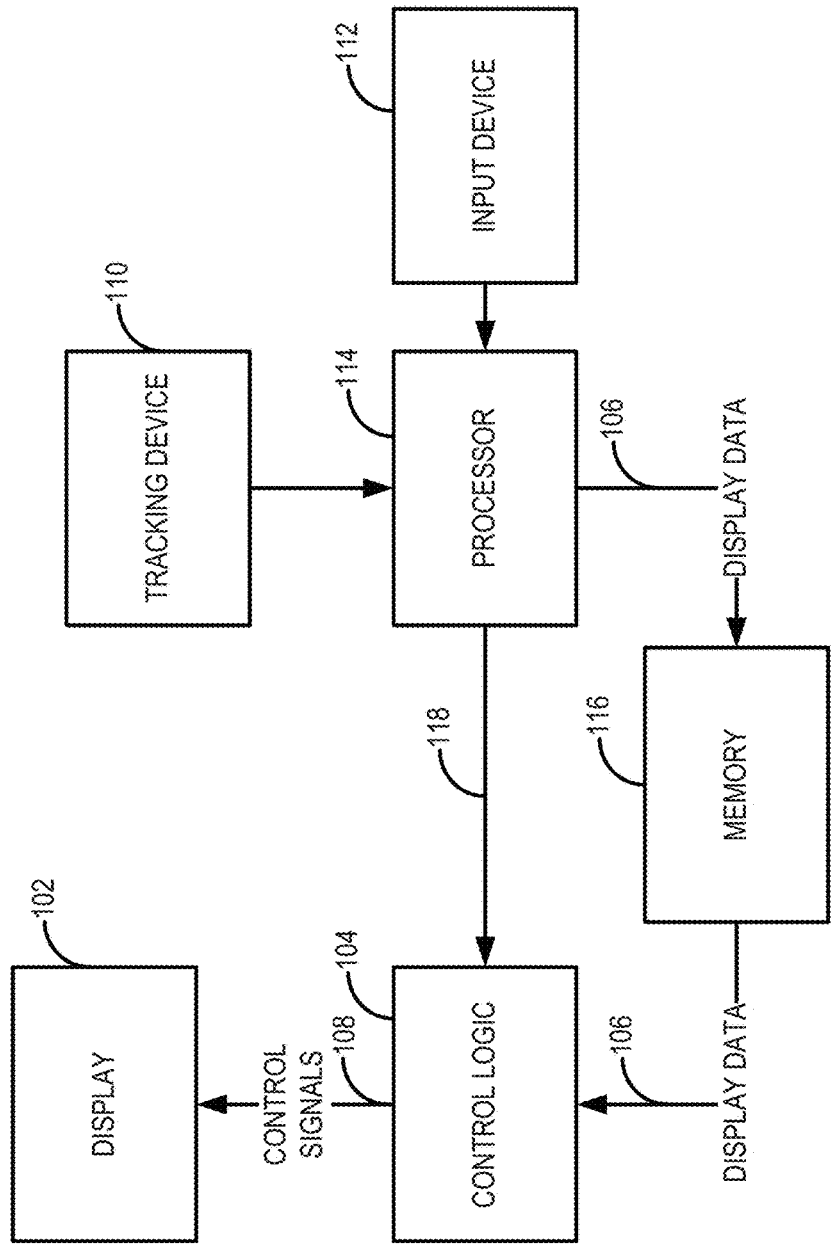

PIXEL BLOCK-BASED DISPLAY DATA PROCESSING AND TRANSMISSION

BACKGROUND

The disclosure relates generally to display technologies, and more particularly, to display data processing and transmission.

Emerging applications of display technologies, such as virtual reality (VR) and augmented reality (AR), oftentimes require high resolution, high frame rate, and low latency in order to provide immersion and prevent cybersickness. Consequently, high data bandwidth at the display interface, e.g., between the graphics processor and the driver integrated circuit (IC) of the displays, becomes a bottleneck of the advancement of next-generation display applications. For example, the data bandwidth at the display interface of traditional display systems may need to reach 138 G bps in an ideal situation for VR application, e.g., retina display at 120 frames per second (fps), which goes beyond the capabilities of most of the known display interfaces.

SUMMARY

The disclosure relates generally to display technologies, and more particularly, to display data processing and transmission.

In one example, a system for compensating display data of an image includes a display, a processor, and control logic operatively coupled to the display and the processor. The display has a plurality of pixels. The processor includes a graphics pipeline configured to generate a set of original display data of the image for a plurality of frames. The processor also includes a pre-processing module configured to determine a still portion of the set of original display data, and generate a set of compensation data for the still portion of the set of original display data. The set of compensation data includes a plurality of sub-sets of compensation data for the plurality of frames. The processor also includes a data transmitter configured to transmit, in each one of the plurality of frames, a stream of display data including one of the plurality of sub-sets of the compensation data. The control logic includes a data receiver configured to receive the stream of display data from the data transmitter, and a post-processing module configured to provide control signals from the stream of display data for driving the display.

In another example, a method for compensating display data of an image includes generating a set of original display data of the image, determining a still portion of the set of original display data and a plurality of frames for compensating the still portion of the set of original display data, and generating a set of compensation data for compensating the still portion of the set of original display data. The set of compensation data includes a plurality of sub-sets of compensation data each being generated in a different one of the plurality of frames.

In still another example, a system for compensating display data of an image includes a display and a processor. The display includes a plurality of pixels. The processor includes a graphics pipeline configured to generate a set of original display data of the image and a pre-processing module. The pre-processing module is configured to determine a still portion and a moving portion of the set of original display data, a first plurality of pixels that display the still portion of the set of original display data, and a second plurality of pixels that display the moving portion of the set of original display data. The pre-processing module is also configured to determine a plurality of frames for compensating the still portion of the set of original display data, and generate a sub-set of compensation data containing compensation values for one or more pixels to be applied on at least one pixel of the first plurality of pixels in a single frame of the plurality of frames. A number of the compensation values can be less than a number of pixels in the first plurality of pixels and a total number of the compensation values generated in the plurality of frames can be equal to the number of pixels in the first plurality of pixels. The pre-processing module is also configured to generate a set of compensation data containing compensation values for all pixels to be applied on all pixels of the second plurality of pixels in the single frame of the plurality of frames.

In yet another example, a system for compensating display data of an image includes a display, a processor, and control logic coupled to the display and the processor. The display includes a plurality of pixels. The processor includes a graphics pipeline configured to generate a set of original display data of the image and a pre-processing module. The pre-processing module is configured to determine a still portion and a moving portion of the set of original display data, a first plurality of pixels that display the still portion of the set of original display data, and a second plurality of pixels that display the moving portion of the set of original display data. The pre-processing module is also configured to determine a plurality of frames for compensating the still portion of the set of original display data, and generate a sub-set of compensation data containing compensation values for one or more pixels to be applied on at least one pixel of the first plurality of pixels in a single frame of the plurality of frames. A number of the compensation values can be less than a number of pixels in the first plurality of pixels and a total number of the compensation values generated in the plurality of frames can be equal to the number of pixels in the first plurality of pixels. The control logic includes a post-processing module that is configured to generate a set of compensation data containing compensation values for all pixels to be applied on all pixels of the second plurality of pixels in the single frame of the plurality of frames.

BRIEF DESCRIPTION OF THE DRAWINGS

The embodiments will be more readily understood in view of the following description when accompanied by the below figures and wherein like reference numerals represent like elements, wherein:

FIG. 1 is a block diagram illustrating an apparatus including a display and control logic in accordance with an embodiment;

DETAILED DESCRIPTION

Figure 2A:
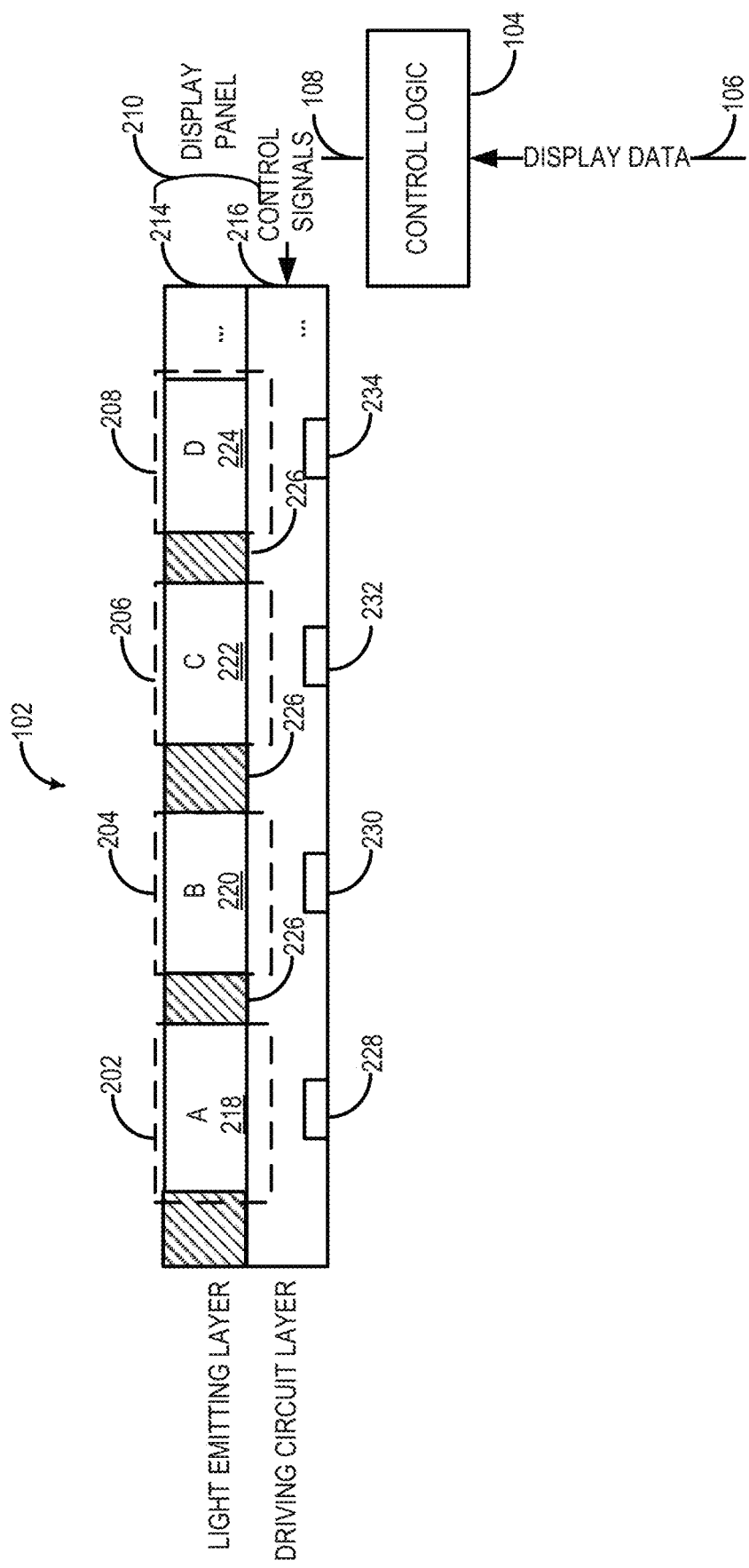
FIGS. 2A-2C are side-view diagrams illustrating various examples of the display shown in FIG. 1 in accordance with various embodiments.

In the following detailed description, numerous specific details are set forth by way of examples in order to provide a thorough understanding of the relevant disclosures. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As will be disclosed in detail below, among other novel features, the display system, apparatus, and method disclosed herein can reduce computation load and improve data bandwidth when compensating display nonuniformities (e.g., "mura" caused by, e.g., fabrication nonuniformities) of a display panel, without sacrificing the display quality of the images displayed by the displayed panel. The present disclosure recognizes that the time for a user to respond to a new image or detect a change in an image (e.g., refocus on the new image or the change) normally takes about 100 milliseconds to about 200 milliseconds. That is, the compensation of display nonuniformities can be completed in an extended time period (e.g., a time period that is longer than a frame) without the user noticing any degradation in display quality. For example, pixels that display original display signals for slow or motionless) features do not need to be compensated in every frame (about 16.6 milliseconds). Instead, the time to complete the compensation of these pixels can be extended to more than one frame. By extending the time to complete the compensation of these pixels, the amount of display data processed and transmitted per frame can be reduced, increasing the data bandwidth and reducing power consumption. The display system can thus improve the allocation of the computing resources for the compensation of pixels for displaying slow/motionless features and pixels for displaying rapid-changing features, and for other activities, allowing images (e.g., high-resolution images) to be displayed more smoothly. In an example, the display system can compute the compensation data for the rapid-changing features in the processor and/or in the control logic to facilitate smooth display of high-resolution images.

Specifically, the compensation pixels for displaying slow/ motionless features can be performed based on pixel blocks. A pixel block can include a plurality of pixels that display a still image or a still portion of an image, when original display signals are applied on these pixels. In each frame, compensation data is generated for compensating one or more pixels in the pixel block. The compensation data may include one or more compensation values for the one or more pixels. The number of frames to complete the compensation of all the pixel in the pixel block can be greater than 2 and less than or equal to the number of pixels in the pixel block. In an example, for a pixel block of four pixels that display a still portion of an image, instead of computing the compensation value for each pixel in each frame, the display system only need to compute the compensation value for a different pixel for four consecutive frames, reducing the computing load to ¼ of other known compensation methods that compute compensation value for each pixel in each frame. Less compensation data needs to be computed and transmitted per frame, so that computing resources and/or data bandwidth for compensating pixels that display high-quality features may be reduced. The allocation of computing resources of the display system may be improved, and power consumption of the display system may be reduced. In some embodiments, the compensation data for pixels that display slow/motionless features is computed by a processor (or an application processor (AP)), and the compensation data for pixels that display rapid-changing features is computed by a control logic (or a display driver integrated circuit (DDIC)).

Moreover, the display system, apparatus, and method disclosed herein can provide flexibilities to the control logic (e.g., driver IC) of the display to adapt computing of compensation data for pixels of various arrangement, thereby further improving the performance of the display, such as reducing power consumption and maintaining apparent display resolution.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

For ease of description, as used herein, "original display data" refers to the display data for display an image and is without/before compensation. As used herein, "an image" can include a plurality of sub-images displayed in a plurality of frames. In each frame, a sub-image is displayed. A "still portion" of the image refers to a portion of the image (e.g., occupying a portion of the display or the entire display) that displays a static or slow-changing feature, and a "moving portion" of the image refers to a portion of the image (e.g., occupying a portion of the display or the entire display) that displays a rapid-changing feature. The portion of the original display data that displays the still portion of the image is referred to as a still portion of the original display data, and the portion of the original display data that displays the moving portion of the image is referred to as a moving portion of the original display data. The portion of compensation data employed to compensate the still portion of the original display data is referred to as low-quality compensation data, and the portion of compensation data employed to compensate the moving portion of the original display data is referred to as high-quality compensation data. The compensation of the pixels that display the still portion of the original display data, using the low-quality compensation data, can be completed in the plurality of frames. The compensation of the pixels that display the moving portion of the original display data, using the high-quality compensation data, can be completed in each of the plurality of frames. In other words, the low-quality compensation data refers to the portion of compensation data generated and applied in the plurality of frames, wherein in each frame, the number of compensation values generated and applied is less than the total number of pixels (e.g., pixels that display the still portion of the image) to be compensated in the plurality of frames. The high-quality compensation data refers to the portion of compensation data generated and applied in each frame, wherein in each frame, the number of compensation values generated and applied is equal to the total number of pixels (e.g., pixels that display the moving portion of the image) to be compensated in this frame.

As used herein, in each of the consecutive frames, a sub-image of the image is displayed by the pixels in the display panel, e.g., by applying a sub-set of the original display data on the pixels of the display panel. As used herein, in each of the consecutive frames, a sub-set of compensation data is generated and transmitted with the sub-set of the original display data to compensate the respective sub-image displayed in this frame. The original display data and the compensation data may together be referred to as display data and can be applied on corresponding pixels through control signals generated based on the display data. As used herein, the method/process that compensates a still portion of an image in the plurality of frames is referred to as a "multi-frame" compensation method/process, and the method/process that compensates a moving portion of an image in each frame is referred to as a "single-frame" compensation method/process. That is, the low-quality compensation data is employed in the multi-frame compensation method/process, and the high-quality compensation data is employed in the single-frame compensation method/process.

In some embodiments, the still portion of an image represents the full image displayed by all the pixels of the entire display panel. In this case, low-quality compensation data is employed in the multi-frame compensation method/process to compensate all the pixels in the plurality of frames. For example, all the pixels of the entire display panel may be divided into blocks, and the compensation of pixels in a block may be completed in a plurality of frames. Details of the compensation method/process are described as follows. In some embodiments, the moving portion of an image represents the full image displayed by all the pixels of the entire display panel. In this case, high-quality compensation data is employed in the single-frame compensation method/process to compensate all the pixels in the plurality of frames. For example, the compensation of all the pixels of the entire display panel may be completed in each frame.

The display system may apply predetermined criteria to determine whether an image should be processed/compensated using high-quality compensation data, low-quality compensation data, or a combination of high-quality compensation data and low-quality compensation data. The criteria may include, e.g., area limits on the display. If the area that shows a still portion exceeds an upper area limit, the image may be compensated using the disclosed multi-frame compensation method employing low-quality compensation data. If the area that shows a still portion is below a lower area limit, the image may be compensated using the single-frame compensation method employing high-quality compensation data. If the area that shows a still portion is between the upper and lower area limits, the image may be divided into the still portion and a moving portion, each respectively being processed/compensated with the multi-frame compensation method/process (e.g., using the low-quality compensation data) and single-frame compensation method/process (e.g., using the high-quality compensation data). In an example, the area limits may include, but not limited to, predetermined area percentages of the display area. For example, the upper area limit (e.g., 70%) may be a percentage of the display area that is higher than the lower area limit (e.g., 20%). In some embodiments, the image is compensated using either low-quality compensation data or high-quality compensation data. For example, if the area that shows a still portion exceeds an area limit (e.g., 50%), the entire image may be compensated using the disclosed multi-frame compensation method using low-quality compensation data. Otherwise, the image may be compensated using the single-frame compensation method using high-quality compensation data.

FIG. 1 illustrates an apparatus 100 including a display 102 and control logic 104. Apparatus 100 may be any suitable device, for example, a VR/AR device (e.g., VR headset, etc.), handheld device (e.g., dumb or smart phone, tablet, etc.), wearable device (e.g., eyeglasses, wrist watch, etc.), automobile control station, gaming console, television set, laptop computer, desktop computer, netbook computer, media center, set-top box, global positioning system (GPS), electronic billboard, electronic sign, printer, or any other suitable device. In this embodiment, display 102 is operatively coupled to control logic 104 and is part of apparatus 100, such as but not limited to, a head-mounted display, computer monitor, television screen, dashboard, electronic billboard, or electronic sign. Display 102 may be an OLED display, liquid crystal display (LCD), E-ink display, electroluminescent display (ELD), billboard display with LED or incandescent lamps, or any other suitable type of display.

Control logic 104 may be any suitable hardware, software, firmware, or combination thereof, configured to receive display data 106 (e.g., pixel data) and generate control signals 108 for driving the subpixels on display 102. Control signals 108 are used for controlling writing of display data to the subpixels and directing operations of display 102. For example, subpixel rendering algorithms for various subpixel arrangements may be part of control logic 104 or implemented by control logic 104. As described in detail below with respect to FIGS. 6 and 8, control logic 104 in one example may include a data receiver 407 and a post-processing module 408 having a control signal generating unit 421 and single-frame compensation data generating unit 422. Control logic 104 may include any other suitable components, such as an encoder, a decoder, one or more processors, controllers, and storage devices. Control logic 104 may be implemented as a standalone integrated circuit (IC) chip, such as an application-specific integrated circuit (ASIC) or a field-programmable gate array (FPGA). Apparatus 100 may also include any other suitable component such as, but not limited to tracking devices 110 (e.g., inertial sensors, camera, eye tracker, GPS, or any other suitable devices for tracking motion of eyeballs, facial expression, head motion, body motion, and hand gesture) and input devices 112 (e.g., a mouse, keyboard, remote controller, handwriting device, microphone, scanner, etc.).

In this embodiment, apparatus 100 may be a handheld or a VR/AR device, such as a smart phone, a tablet, or a VR headset. Apparatus 100 may also include a processor 114 and memory 116. Processor 114 may be, for example, a graphics processor (e.g., graphics processing unit (GPU)), an application processor (AP), a general processor (e.g., APU, accelerated processing unit; GPGPU, general-purpose computing on GPU), or any other suitable processor. Memory 116 may be, for example, a discrete frame buffer or a unified memory. Processor 114 is configured to generate display data 106 in display frames and may temporally store display data 106 in memory 116 before sending it to control logic 104. Processor 114 may also generate other data, such as but not limited to, control instructions 118 or test signals, and provide them to control logic 104 directly or through memory 116. Control logic 104 then receives display data 106 from memory 116 or from processor 114 directly.

FIG. 2A is a side-view diagram illustrating one example of display 102 including subpixels 202, 204, 206, and 208. Display 102 may be any suitable type of display, for example, OLED displays, such as an active-matrix OLED (AMOLED) display, or any other suitable display. Display 102 may include a display panel 210 operatively coupled to control logic 104. The example shown in FIG. 2A illustrates a side-by-side (a.k.a. lateral emitter) OLED color patterning architecture in which one color of light-emitting material is deposited through a metal shadow mask while the other color areas are blocked by the mask.

In this embodiment, display panel 210 includes a light emitting layer 214 and a driving circuit layer 216. As shown in FIG. 2A, light emitting layer 214 includes a plurality of light emitting elements (e.g., OLEDs) 218, 220, 222, and 224, corresponding to a plurality of subpixels 202, 204, 206, and 208, respectively. A, B, C, and D in FIG. 2A denote OLEDs in different colors, such as but not limited to, red, green, blue, yellow, cyan, magenta, or white. Light emitting layer 214 also includes a black array 226 disposed between OLEDs 218, 220, 222, and 224, as shown in FIG. 2A. Black array 226, as the borders of subpixels 202, 204, 206, and 208, is used for blocking lights coming out from the parts outside OLEDs 218, 220, 222, and 224. Each OLED 218, 220, 222, and 224 in light emitting layer 214 can emit a light in a predetermined color and brightness.

In this embodiment, driving circuit layer 216 includes a plurality of pixel circuits 228, 230, 232, and 234, each of which includes one or more thin film transistors (TFTs), corresponding to OLEDs 218, 220, 222, and 224 of subpixels 202, 204, 206, and 208, respectively. Pixel circuits 228, 230, 232, and 234 may be individually addressed by control signals 108 from control logic 104 and configured to drive corresponding subpixels 202, 204, 206, and 208, by controlling the light emitting from respective OLEDs 218, 220, 222, and 224, according to control signals 108. Driving circuit layer 216 may further include one or more drivers (not shown) formed on the same substrate as pixel circuits 228, 230, 232, and 234. The on-panel drivers may include circuits for controlling light emitting, gate scanning, and data writing as described below in detail. Scan lines and data lines are also formed in driving circuit layer 216 for transmitting scan signals and data signals, respectively, from the drivers to each pixel circuit 228, 230, 232, and 234. Display panel 210 may include any other suitable component, such as one or more glass substrates, polarization layers, or a touch panel (not shown). Pixel circuits 228, 230, 232, and 234 and other components in driving circuit layer 216 in this embodiment are formed on a low temperature polycrystalline silicon (LTPS) layer deposited on a glass substrate, and the TFTs in each pixel circuit 228, 230, 232, and 234 are p-type transistors (e.g., PMOS LTPS-TFTs). In some embodiments, the components in driving circuit layer 216 may be formed on an amorphous silicon (a-Si) layer, and the TFTs in each pixel circuit may be n-type transistors (e.g., NMOS TFTs). In some embodiments, the TFTs in each pixel circuit may be organic TFTs (OTFT) or indium gallium zinc oxide (IGZO) TFTs.

As shown in FIG. 2A, each subpixel 202, 204, 206, and 208 is formed by at least an OLED 218, 220, 222, and 224 driven by a corresponding pixel circuit 228, 230, 232, and 234. Each OLED may be formed by a sandwich structure of an anode, an organic light-emitting layer, and a cathode. Depending on the characteristics (e.g., material, structure, etc.) of the organic light-emitting layer of the respective OLED, a subpixel may present a distinct color and brightness. Each OLED 218, 220, 222, and 224 in this embodiment is a top-emitting OLED. In some embodiments, the OLED may be in a different configuration, such as a bottom-emitting OLED. In one example, one pixel may consist of three adjacent subpixels, such as subpixels in the three primary colors (red, green, and blue) to present a full color. In another example, one pixel may consist of four adjacent subpixels, such as subpixels in the three primary colors (red, green, and blue) and the white color. In still another example, one pixel may consist of two adjacent subpixels. For example, subpixels A 202 and B 204 may constitute one pixel, and subpixels C 206 and D 208 may constitute another pixel. Here, since the display data 106 is usually programmed at the pixel level, the two subpixels of each pixel or the multiple subpixels of several adjacent pixels may be addressed collectively by subpixel rendering to present the appropriate brightness and color of each pixel, as designated in display data 106 (e.g., pixel data). However, it is to be appreciated that, in some embodiments, display data 106 may be programmed at the subpixel level such that display data 106 can directly address individual subpixel without subpixel rendering. Because it usually requires three primary colors (red, green, and blue) to present a full color, specifically designed subpixel arrangements may be provided for display 102 in conjunction with subpixel rendering algorithms to achieve an appropriate apparent color resolution.

Figure 2B:
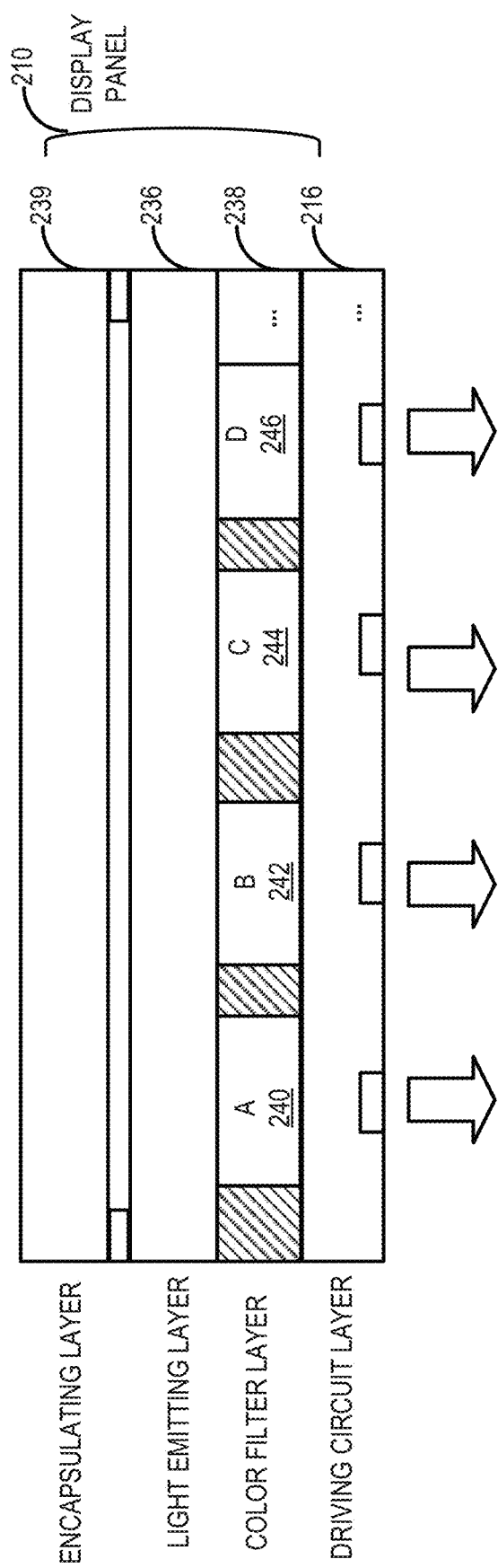

The example shown in FIG. 2A illustrates a side-by-side patterning architecture in which one color of light-emitting material is deposited through the metal shadow mask while the other color areas are blocked by the mask. In another example, a white OLEDs with color filters (WOLED+CF) patterning architecture can be applied to display panel 210. In the WOLED+CF architecture, a stack of light-emitting materials form a light emitting layer of the white light. The color of each individual subpixel is defined by another layer of color filters in different colors. As the organic light-emitting materials do not need to be patterned through the metal shadow mask, the resolution and display size can be increased by the WOLED+CF patterning architecture. FIG. 2B illustrates an example of a WOLED+CF patterning architecture applied to display panel 210. Display panel 210 in this embodiment includes driving circuit layer 216, a light emitting layer 236, a color filter layer 238, and an encapsulating layer 239. In this example, light emitting layer 236 includes a stack of light emitting sub-layers and emits the white light. Color filter layer 238 may be comprised of a color filter array having a plurality of color filters 240, 242, 244, and 246 corresponding to subpixels 202, 204, 206, and 208, respectively. A, B, C, and D in FIG. 2B denote four different colors of filters, such as but not limited to, red, green, blue, yellow, cyan, magenta, or white. Color filters 240, 242, 244, and 246 may be formed of a resin film in which dyes or pigments having the desired color are contained. Depending on the characteristics (e.g., color, thickness, etc.) of the respective color filter, a subpixel may present a distinct color and brightness. Encapsulating layer 239 may include an encapsulating glass substrate or a substrate fabricated by the thin film encapsulation (TFE) technology. Driving circuit layer 216 may be comprised of an array of pixel circuits including LTPS, IGZO, or OTFT transistors. Display panel 210 may include any other suitable components, such as polarization layers, or a touch panel (not shown).

Figure 2C:
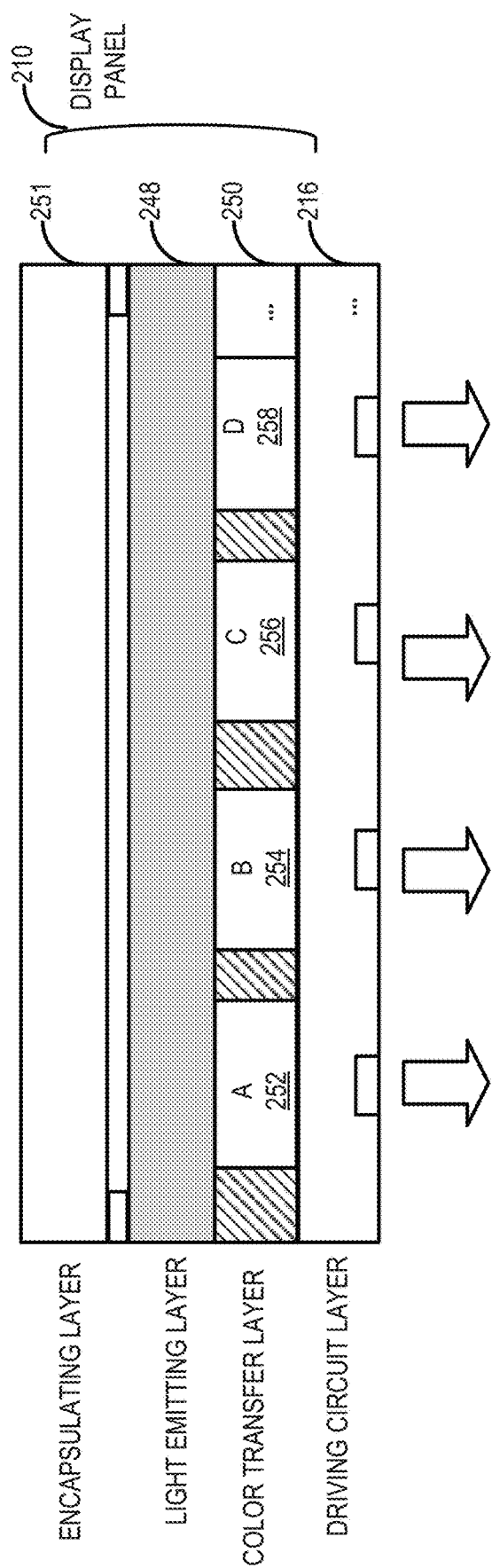

In still another example, a blue OLEDs with transfer color filters (BOLED+transfer CF) patterning architecture can be applied to display panel 210 as well. In the BOLED+transfer CF architecture, a light-emitting material of blue light is deposited without a metal shadow mask, and the color of each individual subpixel is defined by another layer of transfer color filters for different colors. FIG. 2C illustrates an example of a BOLED+transfer CF patterning architecture applied to display panel 210. Display panel 210 in this embodiment includes driving circuit layer 216, a light emitting layer 248, a color transfer layer 250, and an encapsulating layer 251. Light emitting layer 248 in this embodiment emits the blue light and can be deposited without a metal shadow mask. It is to be appreciated that in some embodiments, light emitting layer 248 may emit other colors of light. Color transfer layer 250 may be comprised of a transfer color filters array having a plurality of transfer color filters 252, 254, 256, and 258 corresponding to subpixels 202, 204, 206, and 208, respectively. A, B, C, and D in FIG. 2C denote four different colors of transfer color filters, such as but not limited to, red, green, blue, yellow, cyan, magenta, or white. Each type of transfer color filter may be formed of a color changing material. Depending on the characteristics (e.g., color, thickness, etc.) of the respective transfer color filter, a subpixel may present a distinct color and brightness. Encapsulating layer 251 may include an encapsulating glass substrate or a substrate fabricated by the TFE technology. Driving circuit layer 216 may be comprised of an array of pixel circuits including LTPS, IGZO, or OTFT transistors. Display panel 210 may include any other suitable component, such as polarization layers, or a touch panel (not shown).

The zone-based display data processing and transmission disclosed herein is suitable for any known OLED patterning architectures, including but not limited to, the side-by-side, WOLED+CF, and BOLED+CCM patterning architectures as described above. Although FIGS. 2A-2C are illustrated as an OLED display, it is to be appreciated that they are provided for an exemplary purpose only and without limitations. The zone-based display data processing and transmission disclosed herein may be applied to any suitable display as described above.

Figure 3:
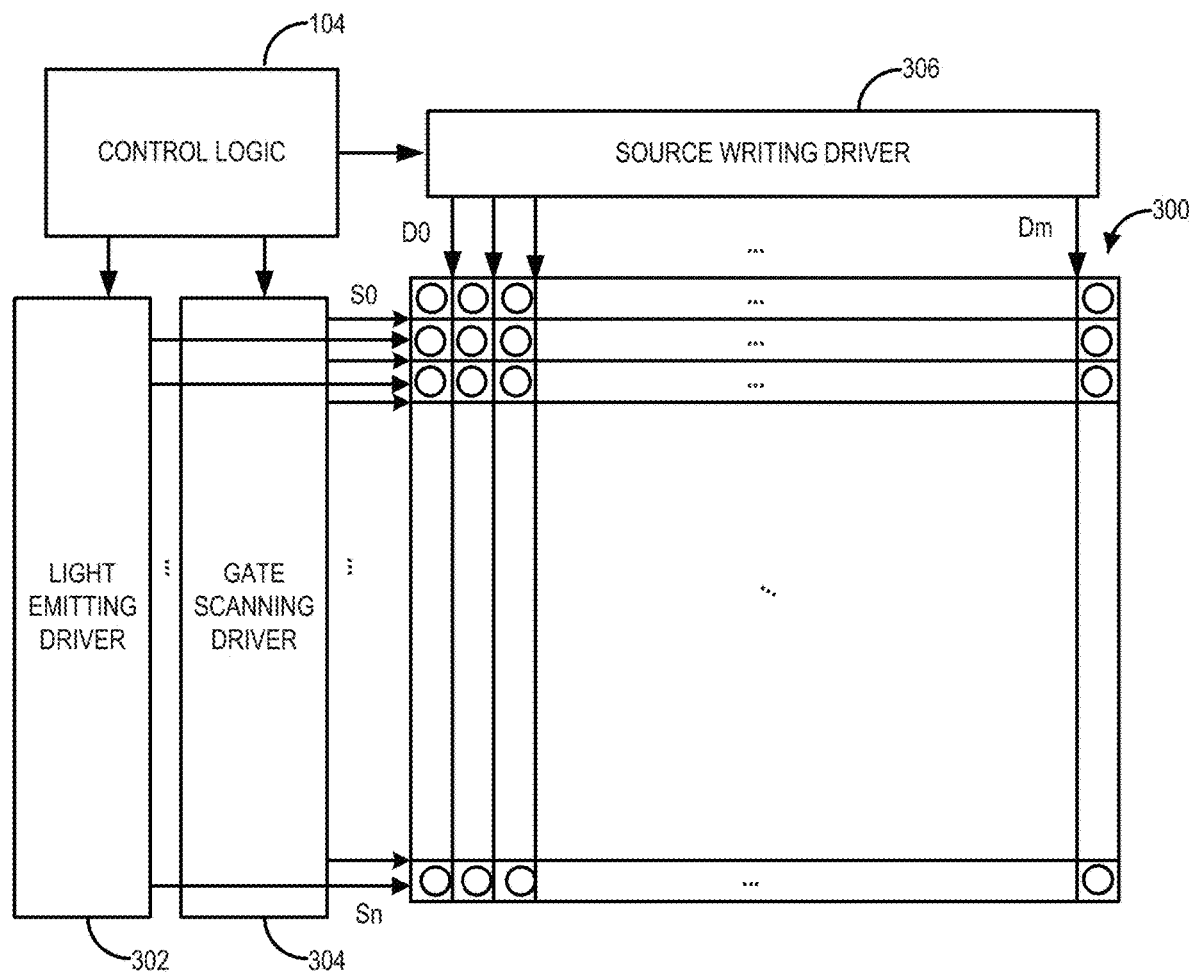
FIG. 3 is a plan-view diagram illustrating the display shown in FIG. 1 including multiple drivers in accordance with an embodiment.

FIG. 3 is a plan-view diagram illustrating display 102 shown in FIG. 1 including multiple drivers in accordance with an embodiment. Display panel 210 in this embodiment includes an array of subpixels 300 (e.g., OLEDs), a plurality of pixel circuits (not shown), and multiple on-panel drivers including a light emitting driver 302, a gate scanning driver 304, and a source writing driver 306. The pixel circuits are operatively coupled to array of subpixels 300 and on-panel drivers 302, 304, and 306. Light emitting driver 302 in this embodiment is configured to cause array of pixels 300 to emit lights in each frame. It is to be appreciated that although one light emitting driver 302 is illustrated in FIG. 3, in some embodiments, multiple light emitting drivers may work in conjunction with each other.

Gate scanning driver 304 in this embodiment applies a plurality of scan signals S0-Sn, which are generated based on control signals 108 from control logic 104, to the scan lines (a.k.a. gate lines) for each row of subpixels in array of subpixels 300 in a sequence. The scan signals S0-Sn are applied to the gate electrode of a switching transistor of each pixel circuit during the scan/charging period to turn on the switching transistor so that the data signal for the corresponding subpixel can be written by source writing driver 306. As will be described below in detail, the sequence of applying the scan signals to each row of array of subpixels 300 (i.e., the gate scanning order) may vary in different embodiments. In some embodiments, not all the rows of subpixels are scanned in each frame. It is to be appreciated that although one gate scanning driver 304 is illustrated in FIG. 3, in some embodiments, multiple gate scanning drivers may work in conjunction with each other to scan array of subpixels 300.

Source writing driver 306 in this embodiment is configured to write display data received from control logic 104 into array of subpixels 300 in each frame. For example, source writing driver 306 may simultaneously apply data signals D0-Dm to the data lines (a.k.a. source lines) for each column of subpixels. That is, source writing driver 306 may include one or more shift registers, digital-analog converter (DAC), multiplexers (MUX), and arithmetic circuit for controlling a timing of application of voltage to the source electrode of the switching transistor of each pixel circuit (i.e., during the scan/charging period in each frame) and a magnitude of the applied voltage according to gradations of display data 106. It is to be appreciated that although one source writing driver 306 is illustrated in FIG. 3, in some embodiments, multiple source writing drivers may work in conjunction with each other to apply the data signals to the data lines for each column of subpixels.

Figure 4A:
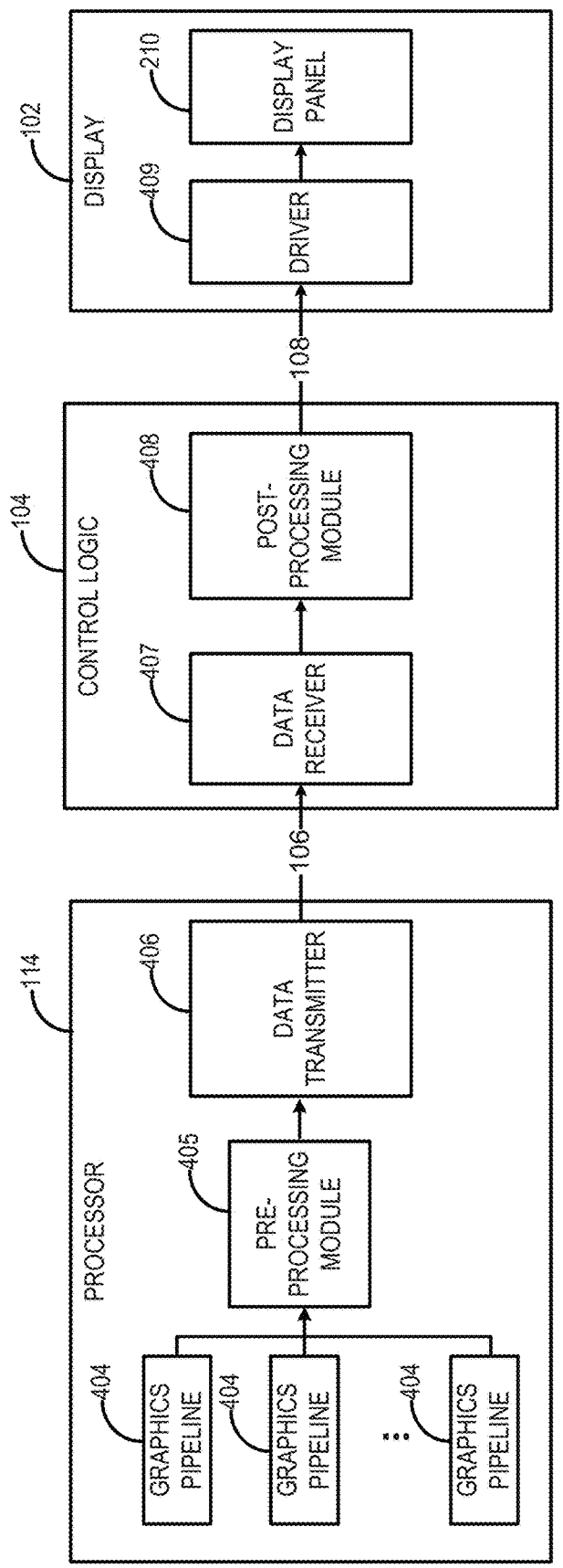
FIG. 4A is a block diagram illustrating a system including a display, a control logic, and a processor in accordance with an embodiment.

FIG. 4A is a block diagram illustrating a display system 400 including a display 102, control logic 104, and a processor 114 in accordance with an embodiment.

As described above, processor 114 may be any processor that can generate display data 106, e.g., pixel data, in each frame and provide display data 106 to control logic 104. Processor 114 may be, for example, a GPU, AP, APU, or GPGPU. Processor 114 may also generate other data, such as but not limited to, control instructions 118 or test signals (not shown in FIG. 4A) and provide them to control logic 104. The stream of display data 106 transmitted from processor 114 to control logic 104 may include original display data and/or compensation data for pixels displaying still and/or moving portions of an image on display panel 210. As a result, the data bandwidth at the display interface (i.e., between processor 114 and control logic 104) and power consumption of display 102 can be reduced compared with known display systems.

In this embodiment, processor 114 includes graphics pipelines 404, a pre-processing module 405, and a data transmitter 406. Each graphics pipeline 404 may be a two-dimensional (2D) rendering pipeline or a three-dimensional (3D) rendering pipeline that transforms 2D or 3D images having geometric primitives in the form of vertices into pieces of display data, each of which corresponds to one pixel on display panel 210. Graphics pipeline 404 may be implemented as software (e.g., computing program), hardware (e.g., processing units), or combination thereof. Graphics pipeline 404 may include multiple stages such as vertex shader for processing vertex data, rasterizer for converting vertices into fragments with interpolated data, pixel shader for computing lighting, color, depth, and texture of each piece of display data, and render output unit (ROP) for performing final processing (e.g., blending) to each piece of display data and write them into appropriate locations of a frame buffer (not shown). Each graphics pipeline 404 may independently and simultaneously process a set of vertex data and generate the corresponding set of display data in parallel.

In this embodiment, graphics pipelines 404 are configured to generate a set of original display data in each frame on display panel 210. Each piece of the set of original display data may correspond to one pixel of the array of pixels on display panel 210. For example, for a display panel having a resolution of 2400×2160, the set of original display data generated by graphics pipelines 404 in each frame includes 2400×2160 pieces of the set of original display data, each of which represents a set of values of electrical signals to be applied to the respective pixel (e.g., consisting of a number of subpixels). The set of original display data may be generated by graphics pipelines 404 at a suitable frame rate (e.g., frequency) at which consecutive display frames are provided to display panel 210, such as 30 fps, 60 fps, 72 fps, 120 fps, or 240 fps.

In this embodiment, graphics pipelines 404 may generate the set of original display data for an image displayed on display panel 210. The image may include a plurality of sub-images displayed in a plurality of frames (e.g., consecutive frames). Each sub-image may be displayed in a different one of the plurality of frames. Different portions of pixels on display panel 210 may, when applied with the original display data (e.g., still portion and moving portion of the original display data), respective display a still portion and a moving portion of the image in the plurality of frames. The still portion of the image may show a static feature and/or a slow-changing motion showing little or no change in the image (e.g., to a user) during the plurality of frames. That is, each sub-image may show unnoticeable change compared to the sub-image displayed in the frame immediately before and/or after. In this embodiment, a moving portion of the image includes a moving feature in (e.g., throughout) the plurality of frames. The moving feature may include rapid-changing motion and/or a drastic change of an object. Sub-images shown in a plurality of frames may each have noticeable changes compared to other sub-image displayed in the plurality of frames. Each of the still portion and the moving portion of the image may be shown in an area smaller than the area of the entire display panel 210 or substantially equal to the area of the entire display panel 210.

Figure 4B:
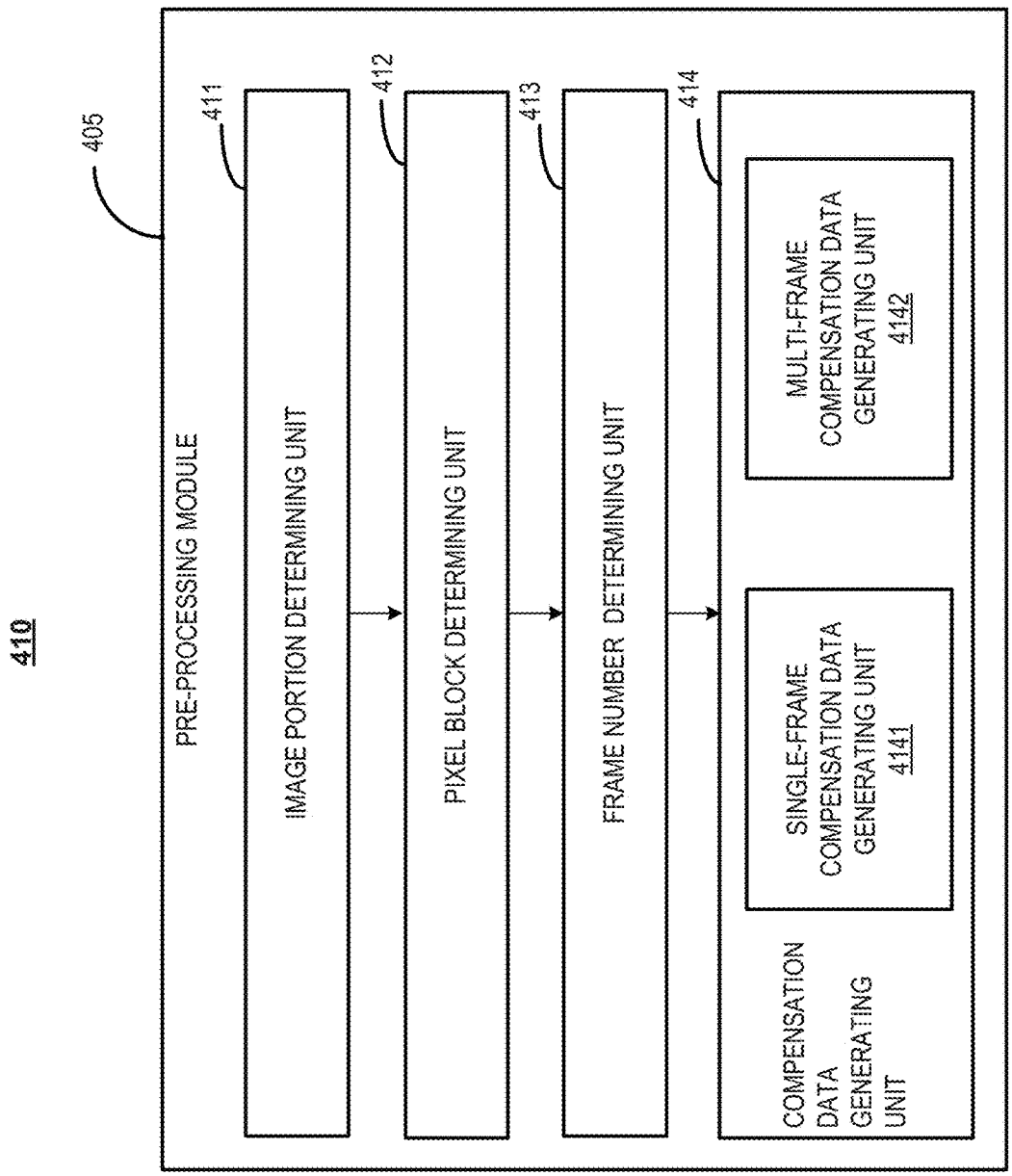
FIG. 4B is a detailed block diagram illustrating one example of a pre-processing module in the processor shown in FIG. 4A in accordance with an embodiment.

In this embodiment, pre-processing module 405 is operatively coupled to graphics pipelines 404 and configured to process the original display data of display panel 210 provided by graphics pipelines 404 to, e.g., generate compensation data and allocate computing resources. FIG. 4B is a detailed block diagram illustrating one example of pre-processing module 405 in processor 114 shown in FIG. 4A in accordance with an embodiment. In this embodiment, pre-processing module 405 includes an image portion determining unit 411, a pixel block determining unit 412, a frame number determining unit 413, and a compensation data generating unit 414. Compensation data generating unit 414 may include a multi-frame compensation data generating unit 4142. In some embodiments, compensation data generating unit 414 also includes a single-frame compensation data generating unit 4141.

In some embodiments, pre-processing module 405 determines a still portion and/or a moving portion of original display data. The determining of a still portion and/or a moving portion of original display data can be performed by image portion determining unit 411. Pre-processing module 405 may determine whether an image (or original display data for displaying the image) is to be processed/compensated using low-quality compensation data and/or high-quality compensation data with predetermined (e.g., pre-stored) criteria. The predetermine criteria may include, but not limited to, area limits of the still portion and/or moving portion of an image. If the area that shows a still portion exceeds an upper area limit, the image may be compensated using the disclosed multi-frame compensation method employing low-quality compensation data. If the area that shows a still portion is below a lower area limit, the image may be compensated using the single-frame compensation method employing high-quality compensation data. If the area that shows a still portion is between the upper and lower area limits, the image may be divided into the still portion and a moving portion, each respectively being processed/compensated with the multi-frame compensation method/process (e.g., using the low-quality compensation data) and single-frame compensation method/process (e.g., using the high-quality compensation data). In an example, the area limits may include, but not limited to, predetermined area percentages of the display area. For example, the upper area limit (e.g., 70%) may be a percentage of the display area that is higher than the lower area limit (e.g., 20%). In some embodiments, the image is compensated using either low-quality compensation data or high-quality compensation data. For example, if the area that shows a still portion exceeds an area limit (e.g., 50%), the entire image may be compensated using the disclosed multi-frame compensation method using low-quality compensation data. Otherwise, the image may be compensated using the single-frame compensation method using high-quality compensation data Pre-processing module 405 may determine a still portion and/or a moving portion based on pre-determined (e.g., pre-stored) criteria such as a range of changes of the color components, luminance components, and/or chrominance components of the original display data. In an example, in a time period, if the change of luminance components of a portion of original display data is within the range (e.g., 10%), the portion of original display data may be determined to be a still portion. In this time period, if the change of luminance components of a portion of original display data exceeds the range, the portion of original display data may be determined to be a moving portion. The time period may include a plurality of frames.

In some embodiments, pre-processing module 405 also determines the pixel blocks applied with the still portion of the original display data. The determining of the pixel blocks can be performed by pixel block determining unit 412. The pixel blocks (e.g., on display panel 210) may receive the still portion of original display data to display the still portion of the image. In some embodiments, pre-processing module 405 determines the number of pixels in each pixel block based on the changing rate of color components, luminance components, and/or chrominance components of the original display data. For example, pre-processing module 405 may determine a first pixel block containing pixels of which the luminance components change at a first rate in the time period and determine a second pixel block containing pixels of which the luminance components change at a second rate in the time period. The first rate can be different from the second rate. In some embodiments, pre-processing module 405 determines the number of pixels in a pixel block to be below a pre-determined number, e.g., to avoid an undesirably long time to compensate portion of original display data displayed by the pixel block.

Figure 5A:
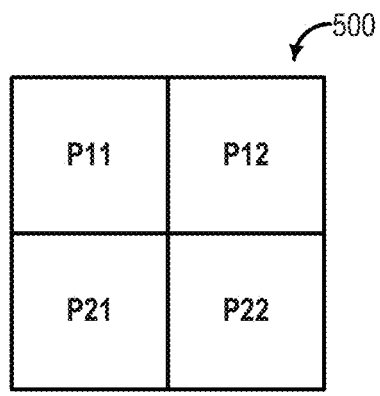
FIG. 5A is a depiction of an example of a pixel block of multiple pixels on a display panel in accordance with an embodiment.

The pixel block may include a plurality of pixels in any suitable arrangement on display panel 210. In some embodiments, each pixel block includes a plurality of pixels arranged in an array (e.g., FIGS. 5A, 6A, and 7A). The array may include even or uneven numbers of rows and columns (e.g., 2 by 2 array as shown in FIG. 5A, 3 by 3 array as shown in 6A, and 4 by 2 array as shown in 7A). In some embodiments, pre-processing module 405 determines the pixels other than the pixels in the pixel blocks to display the moving portion of the image and are compensated in every frame in the time period.

In some embodiments, pre-processing module 405 also determines a frame number (e.g., a number of frames) for compensating the still portion of original display data. The determining of frame number may be performed by frame number determining unit 413. For example, pre-processing module 405 may determine the number of frames to complete the compensation of original display data for each pixel block. Pre-processing module 405 may divide the time period into one or more consecutive sets of frames. Each set of frames may include two or more frames and may be the time span to complete the compensation of original display data of one pixel block. Sub-images of the image may be displayed in the set of frames. In some embodiments, pre-processing module 405 determines a number of frames to complete the compensation of original display data of a pixel block based on the number of pixels in the pixel block. In an example, the number of frames in a set of frames is greater than two and is less than or equal to the number of pixels in the corresponding pixel block. In some embodiments, the number of frames in a set of frames is equal to the number pixels in the corresponding pixel block.

In an example, pre-processing module 405 divides the pixels for displaying the still portion of an image into one or more pixel blocks, each pixel block including two or more pixels (e.g., N pixels, N being a positive integer). If the entire image, displayed by all the pixels of the display panel, is determined to be a still portion, all the pixels of the display panel are divided into a plurality of pixel blocks. Each pixel block, when applied with the corresponding portion of original display data, may display a part of the still portion of the image. The compensation of a pixel block may be completed in a plurality of frames (e.g., a set of M frames, M being a positive integer less than or equal to N). The number of frames associated with different pixel blocks may be the same as or different from one another. In other words, the compensation of different pixel blocks may be completed at different times. In some embodiments, the time span to compensate all the pixel blocks that display the still portion of the image includes a same number of frames.

In some embodiments, in each frame, pre-processing module 405 generates the low-quality compensation data for pixels in the pixel blocks. The generating of low-quality compensation data may be performed by multi-frame compensation data generating unit 4142. For a pixel block with N pixels, multi-frame compensation data generating unit 4142 may generate low-quality compensation data that includes N compensation values to be applied on one or more pixels in the pixel block, in M frames. The low-quality compensation data generated in each frame is referred to as a sub-set of the low-quality compensation data generated in the M frames. Each sub-set of low-quality compensation data may include one or more compensation values to be applied on one or more pixels for the compensation of original display data applied in the respective frame. In some embodiments, pre-processing module 405 generate reference data (e.g., a look-up table) for generating compensation value in each frame. For example, pre-processing module 405 may generate a grayscale look-up table, compare the original display data with the values provided in the grayscale look-up table, and generate compensation values based on the difference between the original display data and the grayscale values provided in the look-up table. The compensation values that are applied on the corresponding pixels may be retained for the rest of the time (e.g., the rest of the frames) of the M frames.

For example, a number of K compensation values may be generated and transmitted in each one of the M frames (K being a positive integer of at least 1). Control signals corresponding to the K compensation values may be applied on J pixels (J being a positive integer of at least one), where J may or may not be the same as K. The J pixels may include the pixels corresponding to the K compensation values. The J pixels may also include other pixels that are not applied with compensation values corresponding to these pixels and may not include the pixels that are already applied with respective compensation values in previous frames. In the first frame of the M frames, compensation values for any pixels may be generated and transmitted. If pixel X is applied with its corresponding compensation value Y at $I^{th}$ frame ($1 \leq I < M$), pixel X may be applied with compensation Y from $I^{th}$ frame to $M^{th}$ frame. At the last frame of the M frames (e.g., the $M^{th}$ frame), all the pixels in the pixel block may be applied with the respective compensation value. In some embodiments, N is equal to M, and one compensation value is applied on one or more pixels in the pixel frame per frame. Details of the compensation mechanism are described in FIGS. 5A-5B, 6A-6E, and 7A-7B.

In some embodiments, pre-processing module 405 also generates the high-quality compensation data for all pixels that display the moving portion of the image. The generating of the high-quality compensation data for the pixels that display the moving portion can be performed by a single-frame compensation data generating unit 4141. Single-frame compensation data generating unit 4141 may be a part of compensation data generating unit 414. In some embodiments, single-frame compensation data generating unit 4141 may generate compensation values for all pixels in each frame.

In some embodiments, pre-processing module 405 determines the units/modules that compute the high-quality compensation data for the pixels that display the moving portion of an image. This process may be performed by image portion determining unit 411. In some embodiments, pre-processing module 405 determines single-frame compensation data generating unit 4141 of pre-processing module 405 calculates the high-quality compensation data for all the pixels that display the moving portion of the image. In some embodiments, pre-processing module 405 determines control logic 104 calculates the high-quality compensation data for all the pixels that display the moving portion. In some embodiments, pre-processing module 405 determines each of single-frame compensation data generating unit 4141 and control logic 408 calculates a portion of the high-quality compensation data for all the pixels that display the moving portion of the image.

In some embodiments, at the $M^{th}$ frame, display data of the compensated still portion and the compensated moving portion (e.g., including the original display data and the respective low-quality and high-quality compensation data for the still portion and the moving portion) may be combined to generate a combined image. Specifically, the low-quality compensation data for the still portion includes the compensation values applied in the M frames on all the pixels in a pixel block, and the high-quality compensation data for the moving portion includes the compensation values at $M^{th}$ frame applied on all the pixels displaying the moving portion of the image.

Figure 4C:
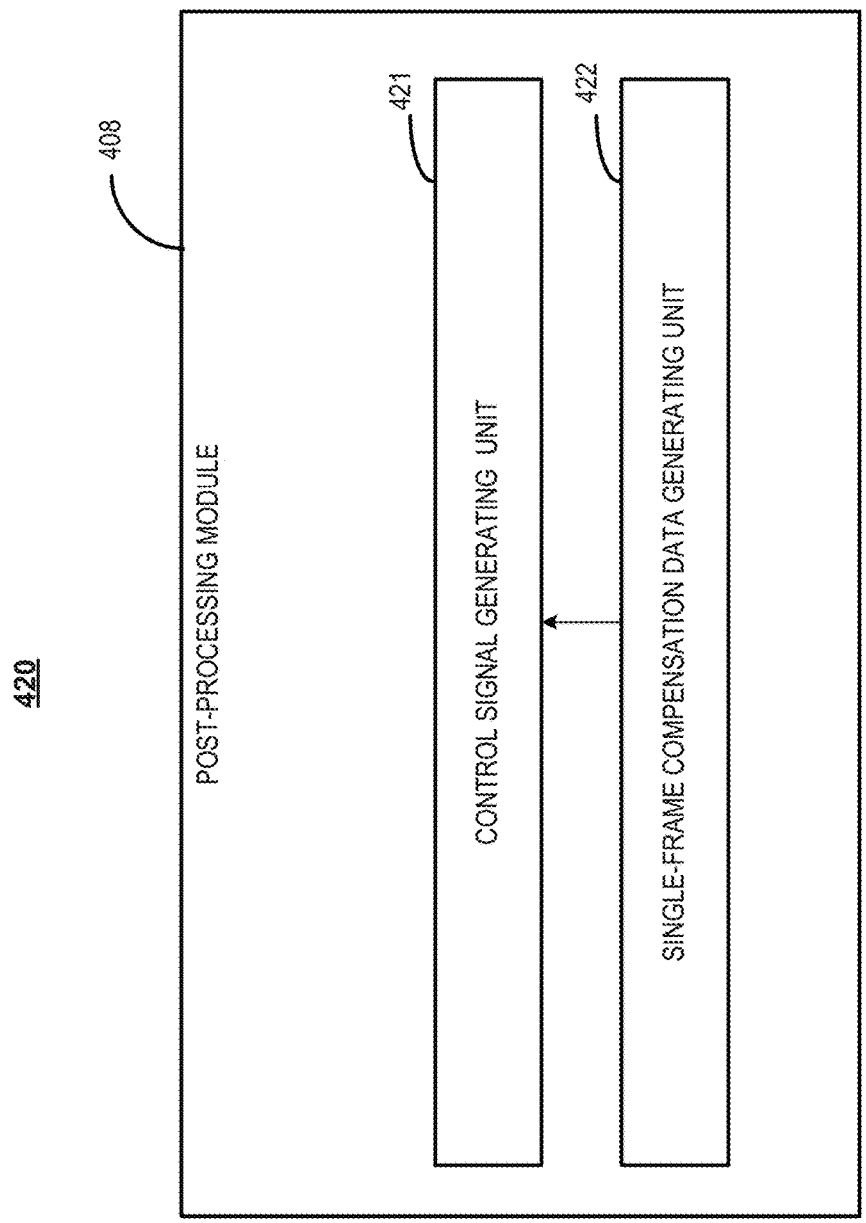
FIG. 4C is a detailed block diagram illustrating one example of a post-processing module in the processor shown in FIG. 4A in accordance with an embodiment.

FIG. 4C illustrates a detailed block diagram illustrating one example of post-processing module 408 in control logic 104 shown in FIG. 4A in accordance with an embodiment. In some embodiments, post-processing module 408 includes a control signal generating unit 421. In some embodiments, post-processing module 408 also includes another single-frame compensation data generating unit 422 coupled to control signal generating unit 421. Single-frame compensation data generating units 422 and 4141 may be similar to each other. Single-frame compensation data generating unit 422 may compute the high-quality compensation data in each frame for the pixels that display a rapid-changing portion of an image, when pre-processing module 405 determines post-processing module 408 computes a portion or entire high-quality compensation data for the pixels that display the moving portion of the image. Accordingly, in each frame, the high-quality compensation data, together with the original display data, may be transmitted to control signal generating unit 421 for generating control signals to be applied on the second portion of pixels.

In some embodiments, control signal generating unit 421 includes a timing controller (TCON) and a clock signal generator. The TCON may provide a variety of enable signals to drivers 409 of display 102. The clock signal generator may provide a variety of clock signals to drivers 409 of display 102. As described above, control signals 108, including the enable signals and clock signals, can control gate scanning driver 304 to scan corresponding rows of pixels according to a gate scanning order and control source writing driver 306 to write each set of display data according to the order of pieces of display data in the set of display data. In other words, control signals 108 can cause the pixels in display panel 210 to be refreshed following a certain order at a certain rate. As described below in detail, the order and rate of refreshing the pixels in the first and second portions of display panel 210 may be determined by control signal generating unit 421 based on the frame rate at which the corresponding set of display data is received by control logic 104.

Figure 4D:
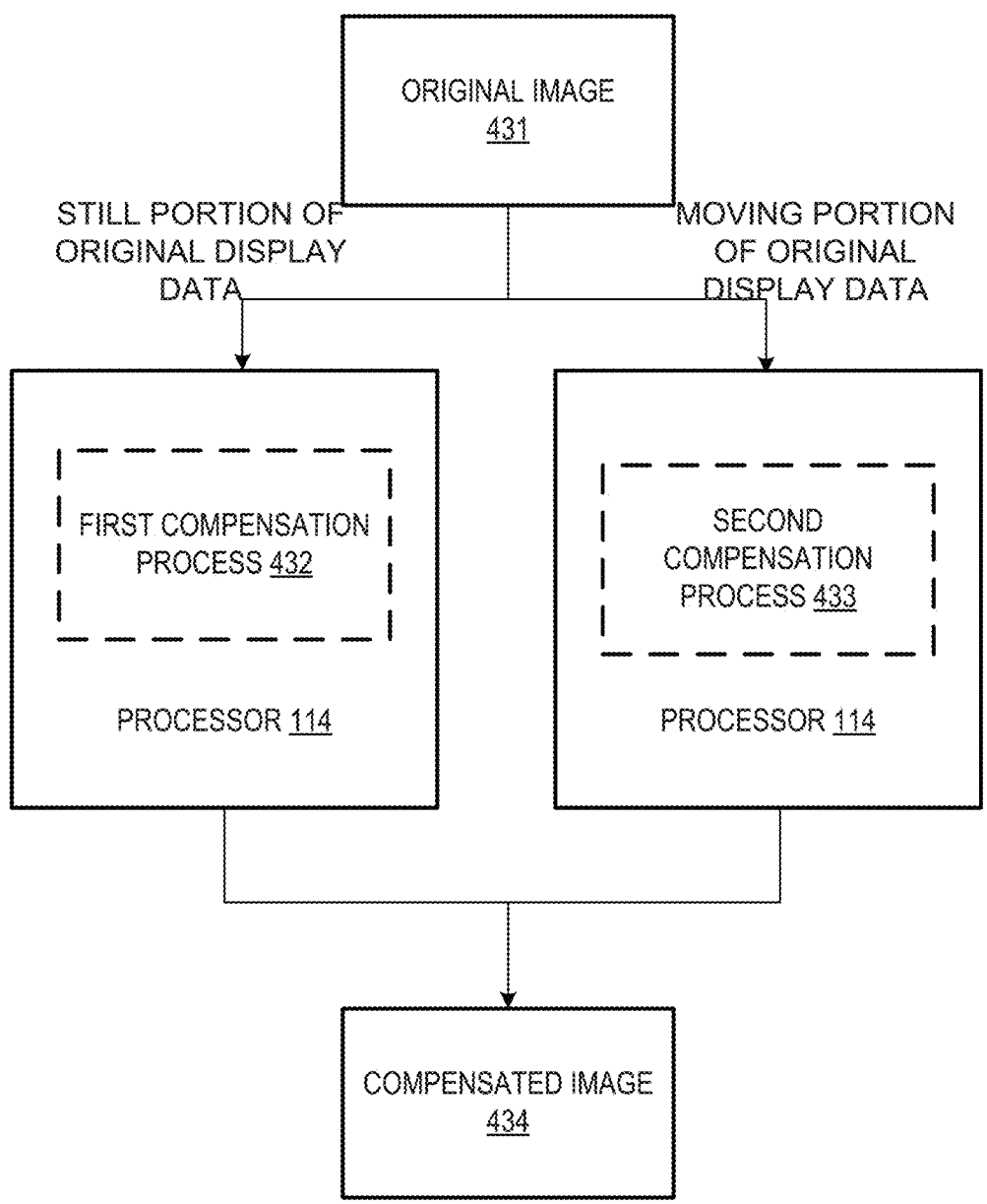
FIGS. 4D and 4E are each a block diagram illustrating a compensation process of original display data of an image displayed in a display panel in accordance with an embodiment.
Figure 4E:
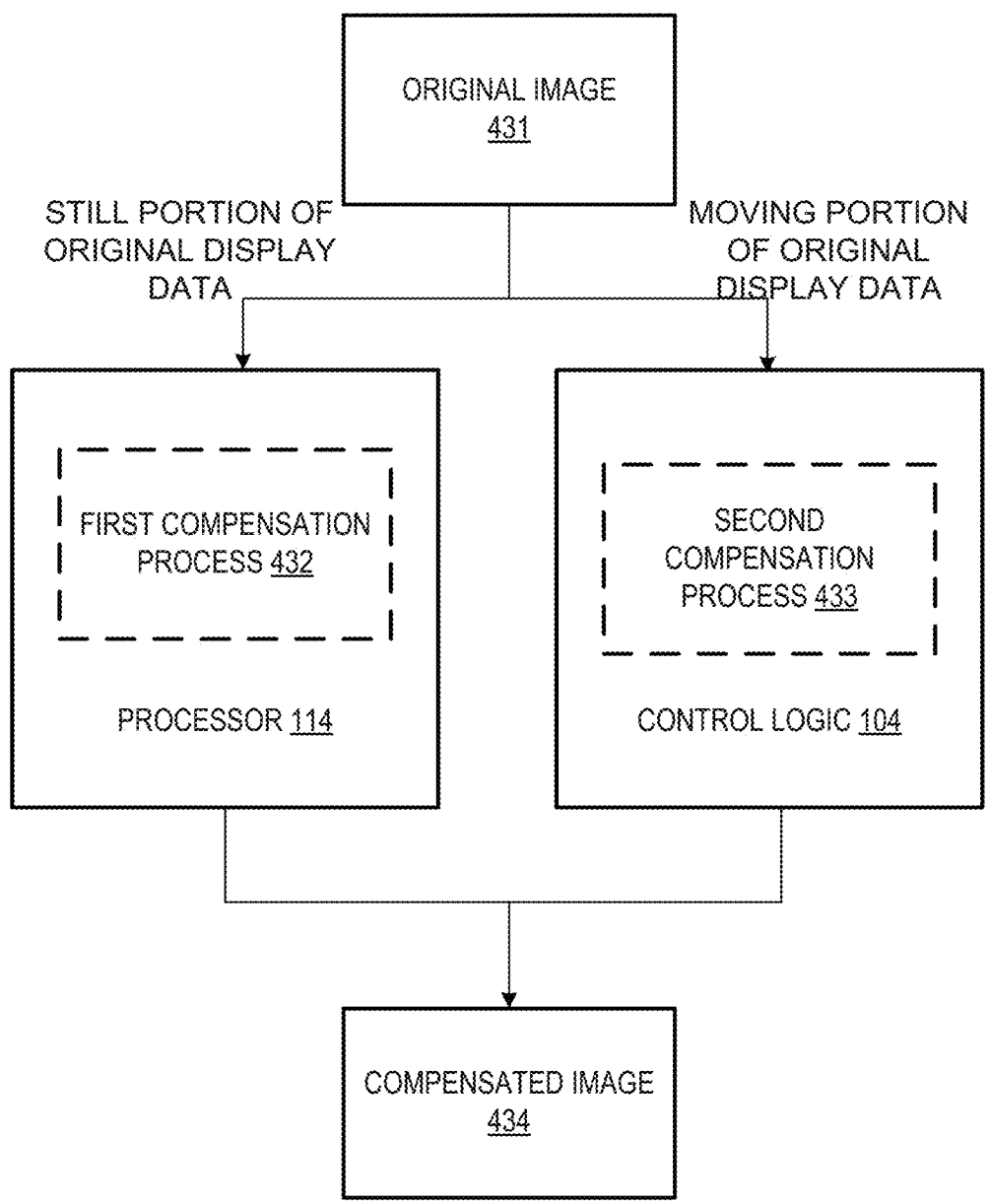

FIGS. 4D and 4E illustrate block diagrams 430 and 440 of exemplary processes to compensate original display data of an image displayed on a display panel, according to embodiments of the present disclosure. In some embodiments, original display data of an original image 431 may be generated by graphics pipelines 404 and transmitted to pre-processing module 405. Original display data may include display data for displaying a still portion and a moving portion of original image 431. The still portion of the image (e.g., displayed as a still portion of original display data) may show a static or slow-changing feature in a time period, and the moving portion of the image (e.g., displayed as a moving portion of the original display data) may show a rapid-changing feature in the time period.

Pre-processing module 405 may determine a first portion of pixels on display panel 210 that receive and display the still portion of original display data, and a second portion of pixels on display panel 210 that receive and display the moving portion of original display data. Pre-processing module 405 may determine one or more pixel blocks in the first portion of pixels and a frame number for each pixel block with which the compensation of all pixels in the pixel block can be completed. In some embodiments, the compensation of all pixels in a pixel block with N pixels can be completed in M frames, M being greater than 2 and less than or equal to N.

Pre-processing module 405 may, in M consecutive frames, sequentially generate N compensation values using a first compensation process 432 (e.g., multi-frame compensation process) for compensating the N pixels of the pixel block. One or more different compensation values are generated in a different one of the M consecutive frames. In some embodiments, pre-processing module 405 may generate reference data for generating compensation value in each frame. For example, pre-processing module 405 may generate a grayscale look-up table, compare the original display data with the values provided in the grayscale look-up table, and generate compensation values based on the difference between the original display data and the grayscale values provided in the look-up table. In each of the M frames, one or more of the N compensation values and original display data for the sub-image of this frame can be transmitted to control logic 104 for post processing, e.g., generating control signals to be applied on pixels. In some embodiments, N is equal to M, and one compensation value is transmitted in each frame and is applied on one or more pixels of the pixel block.

In some embodiments, pre-processing module 405 determines the modules/units to perform the compensation processes for the still portion and the moving portion of the original display data. Pre-processing module 405 may determine pre-processing module 405 of processor 114 to perform first compensation process 432. In some embodiments, as shown in FIG. 4D, pre-processing module 405 (e.g., single-frame compensation data generating unit 4141) of processor 114 may be determined to perform a second compensation process 433 (e.g., single-frame compensation process) to determine the compensation values for each frame for all the pixels in the second portion. These compensation values may also be transmitted with original display data to control logic 104 for post processing (e.g., generation of control signals). In some embodiments, as shown in FIG. 4E, post-processing module 408 (e.g., single-frame compensation data generating unit 422) of control logic 104 may be determined to perform the second compensation process 433 to determine the compensation values for each frame for all the pixels in the second portion. In some embodiments, pre-processing module 405 and post-processing module 408 may each perform a part of second compensation process 433.

In each frame, original display data and compensation values for first portion and second portions of pixels may be transmitted to control logic 104. Control signals corresponding to the original display data and compensation values may be generated by control logic 104 and applied on corresponding pixels on display panel 210.

In some embodiments, in each frame, control signals for displaying a sub-image of the image and compensating one or more pixels in the pixel block are applied on the corresponding pixel block. Control signals associated with the compensation values of one or more pixel in the pixel block may be sequentially applied on one or more pixels in the pixel block in a different frame of M frames. By the $M^{th}$ frame (e.g., last frame of the M frames), control signals (of the original display data and the compensation data for M frames) for all the pixels in the first portion and the second portion may sequentially be applied on the corresponding pixels, and a compensated image 434 may be displayed on display panel 210.

Returning back to FIG. 4A, data transmitter 406 in this embodiment is operatively coupled to pre-processing module 405 and configured to transmit stream of display data 106 in each frame to control logic 104. Stream of display data 106 may include a sub-set of original display data of an image and compensation values to be applied on corresponding pixels in each frame. For example, in each frame, a sub-set of original display data (e.g., for displaying a sub-image) and one or more compensation values may be transmitted as display data 106. The compensation values may be employed to compensate one or more pixels in a pixel block that displays a still portion of the image. In one example, in a frame, display data 106 may also include compensation values for compensating all pixels that display the moving portion of the image.

Data transmitter 406 may be any suitable display interface between processor 114 and control logic 104, such as but not limited to, display serial interface (DSI), display pixel interface (DPI), and display bus interface (DBI) by the Mobile Industry Processor Interface (MIPI) Alliance, unified display interface (UDI), digital visual interface (DVI), high-definition multimedia interface (HDMI), and DisplayPort (DP). Based on the specific interface standard adopted by data transmitter 406, stream of display data 106 may be transmitted in series in the corresponding data format along with any suitable timing signals, such as vertical synchronization (V-Sync), horizontal synchronization (H-Sync), vertical back porch (VBP), horizontal back porch (HBP), vertical front porch (VFP), and horizontal front porch (HVP), which are used to organize and synchronize stream of display data 106 in each frame with the array of pixels on display panel 210.

In addition to transmitting stream of display data 106 to control logic 104, data transmitter 406 may also transmit other control data (e.g., commands/instructions) or status information to control logic 104 and/or receive information (e.g., status or pixel information) from control logic 104 or display panel 210. For example, information related to the division of the pixels on display panel 210 into a first portion for displaying a still portion of an image and a second portion for displaying a moving portion of the image, and information related to the division of pixel blocks amongst the first portion of pixels on display panel 210, may be transmitted by data transmitter 106. In some embodiments, the control data and status information may be embedded in stream of display data 106. In some embodiments, the control data and status information may be transmitted via a side channel separate from the channel used for transmitting stream of display data 106.

Figure 5B:
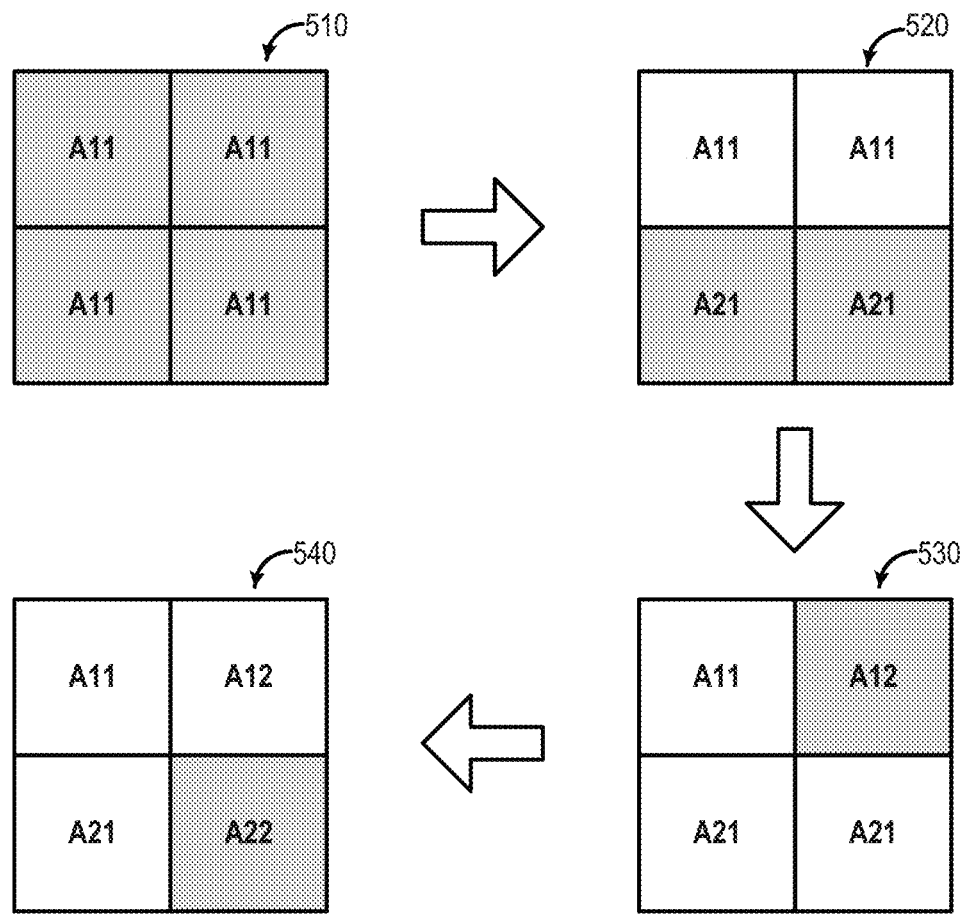
FIG. 5B is a depiction of an example of compensating the pixel block of FIG. 5A in accordance with an embodiment.
Figure 6A:
FIG. 6A is another depiction of another example of another pixel block of multiple pixels on a display panel in accordance with an embodiment.
Figure 6B:
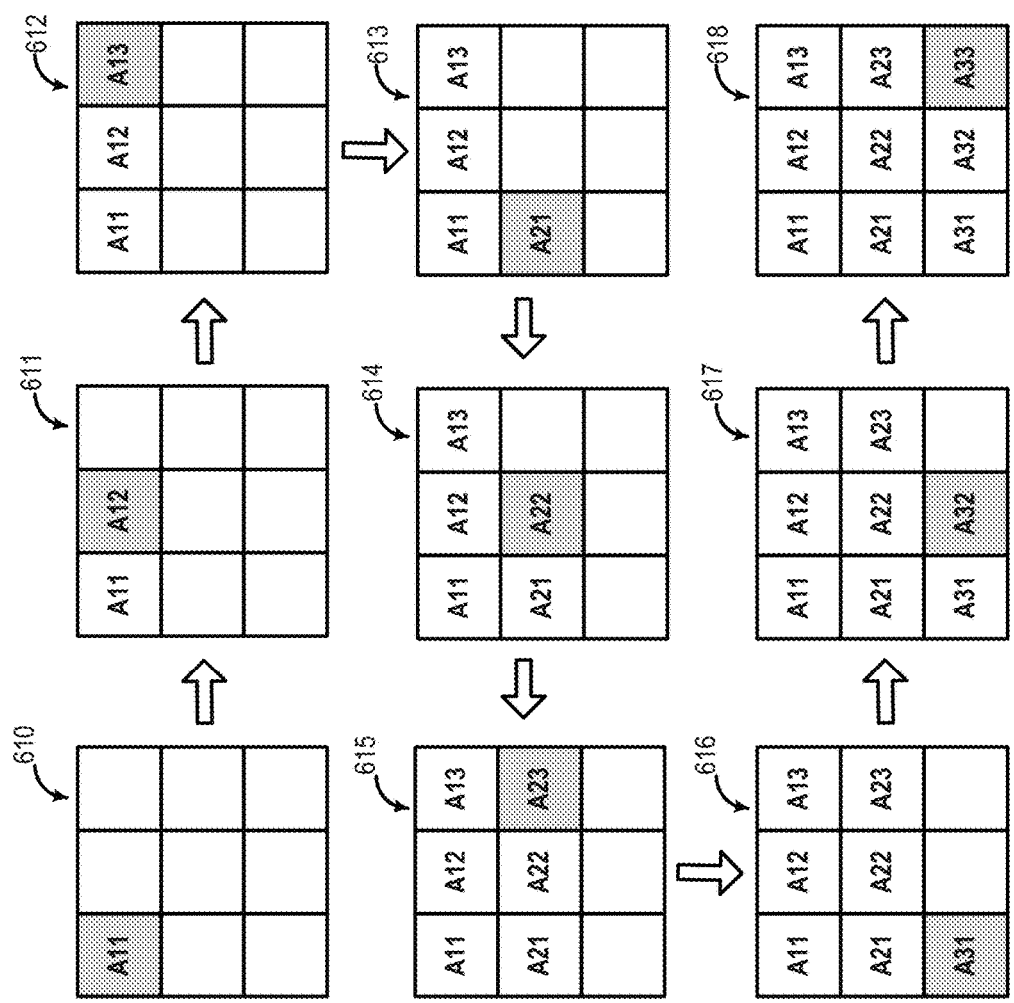
FIGS. 6B-6E are each a different depiction of an example of compensating the pixel block of FIG. 6A in accordance with an embodiment.
Figure 6C:
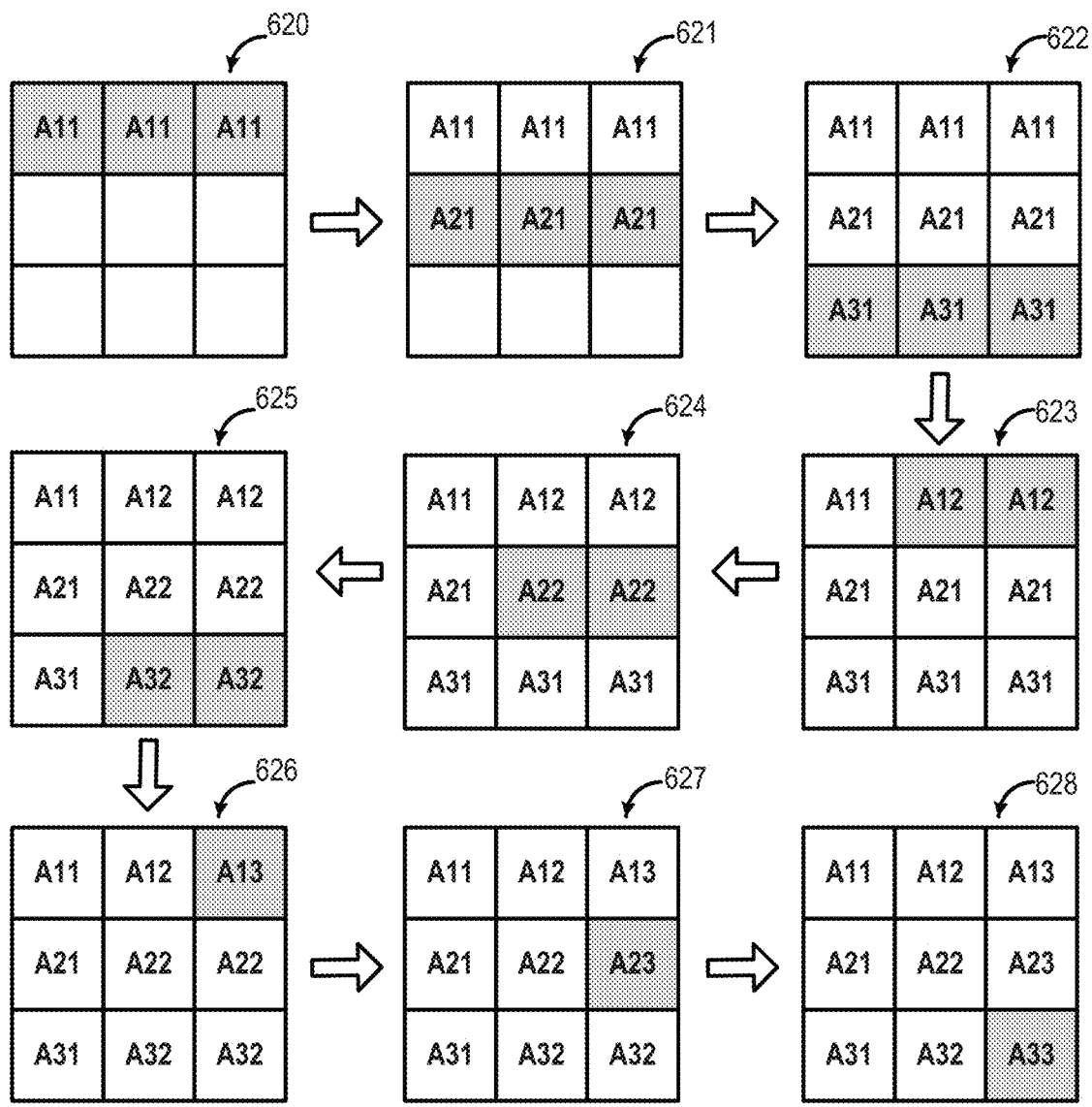
Figure 6D:
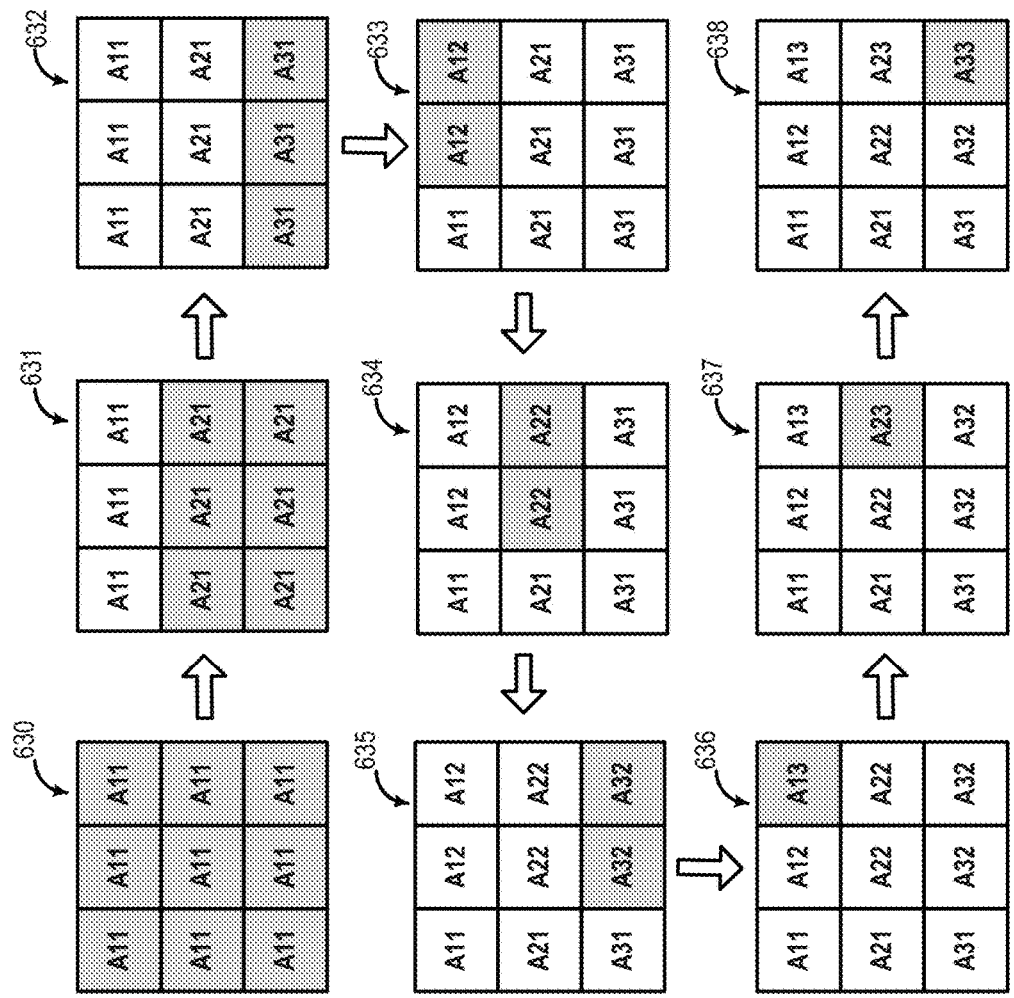
Figure 6E:
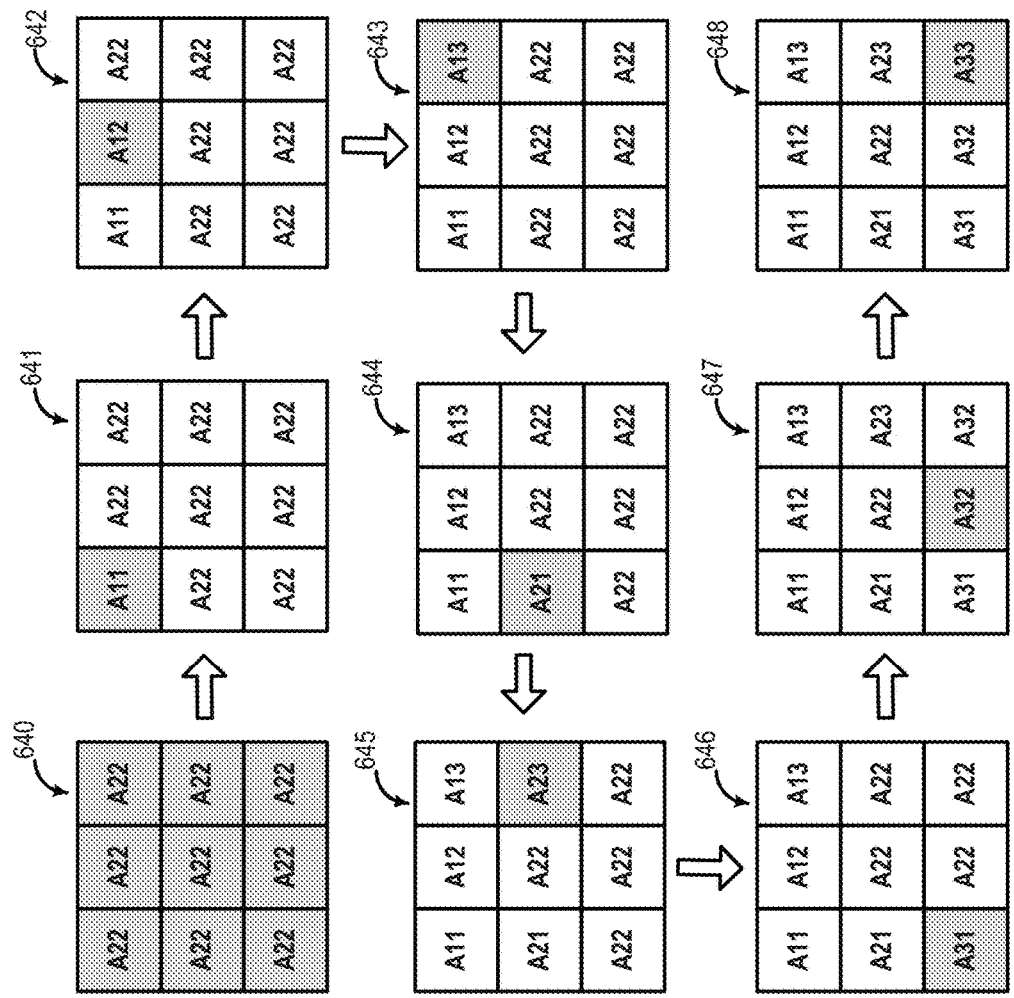
Figure 7A:
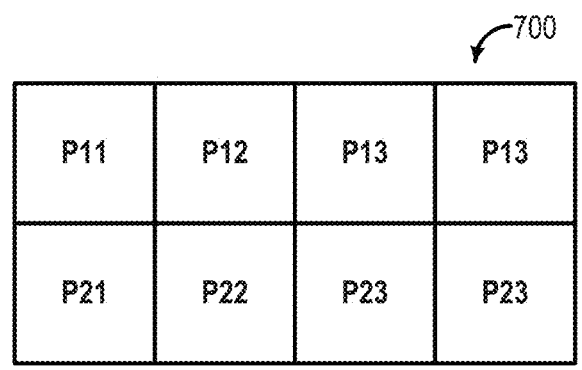
FIG. 7A is another depiction of another example of another pixel block of multiple pixels on a display panel in accordance with an embodiment.
Figure 7B:
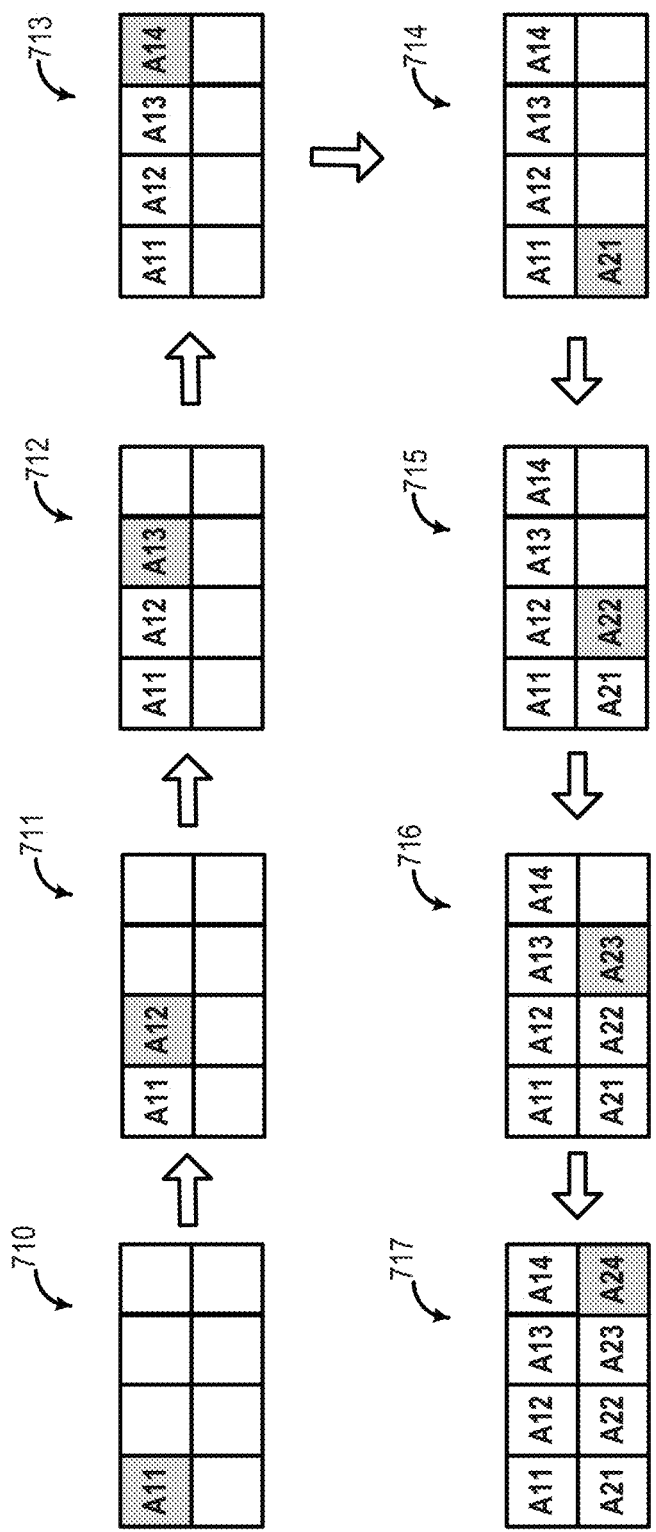
FIG. 7B is a depiction of an example of compensating the pixel block of FIG. 7A in accordance with an embodiment.

FIGS. 5A-5B, 6A-6E, and 7A-7B illustrate different pixel blocks being applied with corresponding compensation values in a plurality of frames, according to embodiments of the present disclosure. As shown in the figures, a pixel block may include a plurality of pixels arranged in an array. For example, as shown in FIGS. 5A, 6A, and 7A, the number of pixels in pixel blocks 500, 600, and 700 may each be greater than 2. The number of rows and the number of columns of the array may or may not be the same. In some embodiments, in each of the M frames, one compensation value (e.g., for the compensation of one pixel in the respective pixel block) is applied on one or more pixels. The one or more pixels may include the pixel corresponding to the compensation value and one or more other pixels that are to be compensated with the corresponding compensation values in subsequent frames. The one or more pixels may not include pixels that are already compensated with corresponding compensation values in previous frames. The one or more pixels may be a single pixel, a portion of a row (e.g., two or more pixels), a portion of a column (e.g., two or more pixels), or a combination thereof. In some embodiments, for the same pixel block, the result of the compensation process (e.g., multi-frame compensation process) in the last frame (e.g., the $M^{th}$ frame) may be the same for different variation of the compensation process. In some embodiments, when compensation values of adjacent frames are sufficiently close, compensation value of one frame may be determined based on the compensation values of one or more frames immediately before the frame.

In an example, as shown in FIG. 6A FIG. 5A, pixels P11-P22 may be four pixels in a 2 by 2 pixel block 500. A11-A22 represents four compensation values respectively for pixels P11-P22. As shown in FIG. 5B, the compensation process may be completed in four frames (e.g., the frame number being equal to the number of pixels in pixel block 500). In a first frame 510, A11 may be applied on all four pixels P11-P22 of pixel block 500. In a second frame 520, A21 may be applied on P21 and P22, and A21 may replace A11 on pixel P21. In a third frame 530, A12 may be applied on P12 to replace A11 on pixel P12. In a fourth frame 540, A22 may be applied on P22 to replace A21 on pixel P22. As shown in FIG. 5B, at the last frame (e.g., fourth frame 540) of the M frames, each pixels of the pixel block may be applied with the corresponding compensation value.

Other examples may be illustrated in FIGS. 6A-6E. Pixels P11-P33 may be nine pixels in a 3 by 3 pixel block 600. In one example shown in FIG. 6B, in each of the consecutive nine frames 610-618, compensation value of one pixel (e.g., A11-A33) is sequentially applied on one pixel of pixel block 600. The order to apply the compensation value is from P11 to P13, from P21 to P23, and from P31 to P33. In another example shown in FIG. 6C, in each of the consecutive nine frames 620-628, compensation value of one pixel (e.g., A11-A33) is sequentially applied on one or more pixels of pixel block 600. Specifically, from frame 620 to frame 622, compensation values A11, A21, and A31 may be sequentially applied on row 1, row 2, and row 3 of pixel block 600; from frame 623 to frame 625, compensation values A12, A22, and A32 may be sequentially applied on a portion (e.g., the last two pixels) of row 1 (e.g., P12, and P 13), a portion of row 2 (e.g., P22 and P23), and a portion of row 3 (e.g., P32 and P33) of pixel block 600; and from frame 626 to frame 628, compensation values A13, A23, and A33 may be sequentially applied on another portion (e.g., the last pixel) of row 1 (e.g., P 13), another portion of row 2 (e.g., P23), and another portion of row 3 (e.g., P33) of pixel block 600.

In another example shown in FIG. 6D, in each of the consecutive nine frames 630-638, compensation value of one pixel (e.g., A11-A33) is sequentially applied on one or more pixels of pixel block 600. Specifically, from frame 630 to frame 622, compensation values A11, A21, and A31 may be sequentially applied on row 1 to row 3, row 2 to row 3, and row 3 of pixel block 600; from frame 633 to frame 635, compensation values A32, A22, and A12 may be sequentially applied on a portion (e.g., the last two pixels) of row 3 (e.g., P32, and P 33), row 2 (e.g., P22 and P23), and row 1 (e.g., P12 and P13) of pixel block 600; and from frame 636 to frame 638, compensation values A13, A23, and A33 may be sequentially applied on the last pixel of the row 1 (e.g., P13), row 2 (e.g., P23), and row 3 (e.g., P33) of pixel block 600. In another example shown in FIG. 6E, in each of the consecutive nine frames 640-648, compensation value of one pixel (e.g., A22, A11, A12, A13, A21, A23, A31, A32, and A33) is sequentially applied on one or more pixels of pixel block 600. Specifically, in first frame 640, compensation value A22 may be applied on all pixels of pixel block 600; from second frame 641 to ninth frame 648, compensations values A22, A11, A12, A13, A21, A23, A31, A32, and A33 are each sequentially applied on the corresponding pixel in a different frame.

The multi-frame compensation method can also be used to compensate pixels in a pixel block with uneven numbers of rows and columns. In an example, pixels P11-P23 are eight pixels in a 2 by 4 array, as shown in FIG. 7A. In each of the consecutive eight frames 710-717, compensation value of one pixel (e.g., A11-A14 and A21-A24) are sequentially applied on the corresponding pixel of pixel block 700. In eighth frame 717, all the eight pixels are applied with the corresponding compensation values A11-A24.

Figure 8:
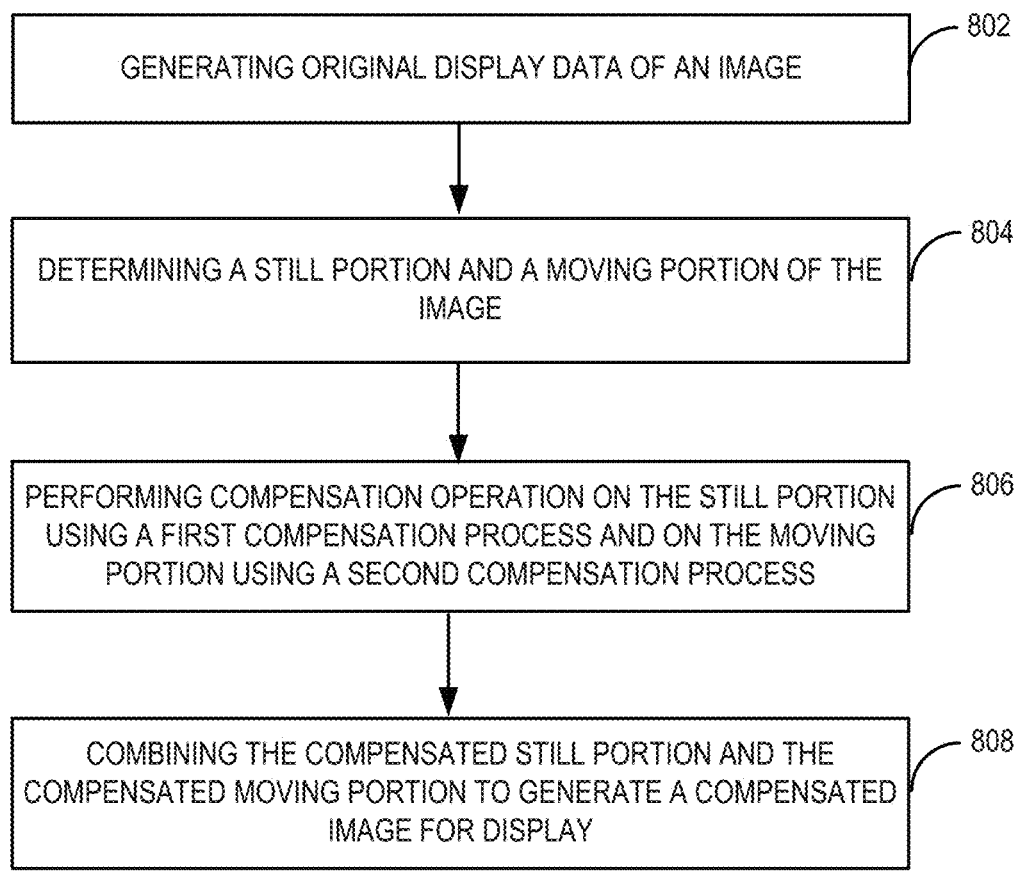
FIG. 8 is a flow chart of a method for compensating an image displayed in a display panel in accordance with an embodiment.

FIG. 8 is a flow chart of a method 800 for compensating a still portion and a moving portion of an image in accordance with an embodiment. It will be described with reference to the above figures, such as FIG. 4D. However, any suitable circuit, logic, unit, or module may be employed. The method can be performed by any suitable circuit, logic, unit, or module that can comprise hardware (e.g., circuitry, dedicated logic, programmable logic, microcode, etc.), software (e.g., instructions executing on a processing device), firmware, or a combination thereof. It is to be appreciated that not all steps may be needed to perform the disclosure provided herein. Further, some of the steps may be performed simultaneously, or in a different order than shown in FIG. 8, as will be understood by a person of ordinary skill in the art.

Starting at 802, original display data of an image (e.g., original image) may be generated. Original display data may include display information such as color components, luminance components, and/or chrominance components of each pixel on display panel 210. This process may be performed by graphics pipeline 404. At 804, a still portion and a moving portion of the image may be determined. Based on the original display data, a still portion showing slow or no motion in a time period and a moving portion showing rapid motion in a time period may be determined. This process may be performed by pre-processing module 405. At 806, a first compensation process may be performed to generate low-quality compensation data for the still portion and a second compensation process may be performed to generate high-quality compensation data for the moving portion. Pixel blocks and corresponding frame numbers may be determined for a first compensation process (e.g., multi-frame compensation process). For a pixel block having N pixels, frame number M may be greater than 2, and less than or equal to N. The second compensation process may include a single-frame compensation process. This process may be performed by pre-processing module 405 and/or post-processing module 408. At 808, the compensated still portion and the compensated moving portion of the image may be combined to generate a compensated image for display. In each frame, display data (e.g., respective compensation data for the still portion and for the moving portion, together with the original display data) may be transmitted to control signal generating unit 421, for generating control signals to be applied on corresponding pixels for displaying the compensated image (or sub-image) of this frame. The displaying of images can be performed by driver 409 and display panel 210.

Figure 9:
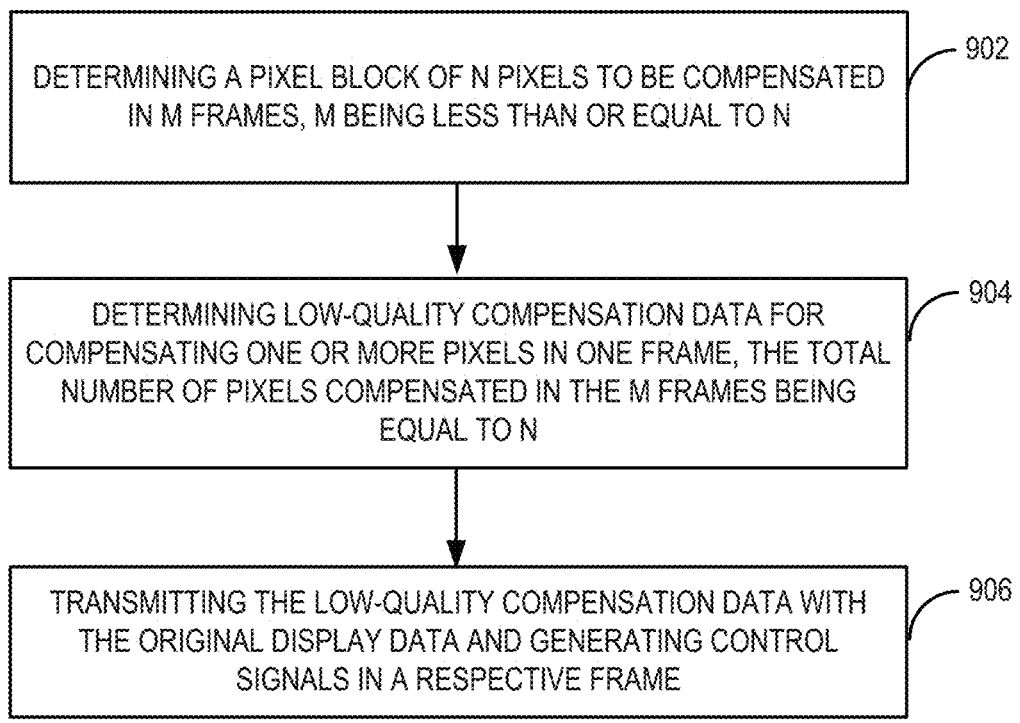
FIG. 9 is a flow chart of a multi-frame compensation method for compensating a still portion of an image in accordance with an embodiment.

FIG. 9 is a flow chart of a multi-frame compensation method 900 for compensating a still portion of original display data of a display panel having a plurality of pixels, in accordance with an embodiment. Method 900 may be performed in step 806 and 808 of method 800. It will be described with reference to the above figures. However, any suitable circuit, logic, unit, or module may be employed. The method can be performed by any suitable circuit, logic, unit, or module that can comprise hardware (e.g., circuitry, dedicated logic, programmable logic, microcode, etc.), software (e.g., instructions executing on a processing device), firmware, or a combination thereof. It is to be appreciated that not all steps may be needed to perform the disclosure provided herein. Further, some of the steps may be performed simultaneously, or in a different order than shown in FIG. 9, as will be understood by a person of ordinary skill in the art.

Starting at 902, a pixel block of N pixels to be compensated in M frames may be determined. The pixel block may, when applied with the original display data, display a still portion of an image in M frames. It can be determined that M is at least 2 and is less than or equal to N. This may be performed by pre-processing module 405. At 904, low-quality compensation data for compensating one or more pixels of the pixel block in one frame may be determined. The total number of pixels compensated in the M frames may be equal to N. In each frame, low-quality compensation data that includes the compensation values of one or more pixels may be generated and transmitted. The compensation values may be applied on the corresponding pixels and other pixels. These compensation values may not be applied on the pixels that are already applied with corresponding compensation values in previous frames. The total number of pixels applied with the corresponding compensation values in the M frames may be equal to N. This may be performed by pre-processing module 405. At 906, in each frame, the low-quality compensation data for the one or more pixels and the corresponding original display data may be transmitted to control logic 104, and control signals corresponding to the transmitted low-quality compensation data and original display data may be generated. This may be performed by pre-processing module 405, data transmitter 406, and control logic 104.

Also, integrated circuit design systems (e.g. work stations) are known that create wafers with integrated circuits based on executable instructions stored on a computer-readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic, units, and circuits described herein may also be produced as integrated circuits by such systems using the computer-readable medium with instructions stored therein.

For example, an integrated circuit with the aforedescribed logic, units, and circuits may be created using such integrated circuit fabrication systems. The computer-readable medium stores instructions executable by one or more integrated circuit design systems that causes the one or more integrated circuit design systems to design an integrated circuit. In one example, the designed integrated circuit includes a graphics pipeline, a pre-processing module, and a data transmitter. The graphics pipeline is configured to generate a set of original display data in each frame. The pre-processing module is configured to determine the computing resources of compensation processes for a still portion and a moving portion of an image and perform multi-frame compensation process on pixels that display the still portion of the image in a plurality of frames. The data transmitter is configured to transmit, to control logic operatively coupled to the display, in each frame, a stream of display data comprising original display data and the corresponding compensation data.

The above detailed description of the disclosure and the examples described therein have been presented for the purposes of illustration and description only and not by limitation. It is therefore contemplated that the present disclosure covers any and all modifications, variations or equivalents that fall within the spirit and scope of the basic underlying principles disclosed above and claimed herein.

What is claimed is:

1. A system for compensating display data of an image, comprising:
   a display having a plurality of pixels arranged in a row direction and a column direction; and
   a processor, comprising:
      a graphics pipeline that generates a set of original display data and a set of compensation data of the image;
      a pre-processing module configured to:
         divide pixels for displaying a still portion of the set of original display data into a plurality of pixel blocks, each pixel block having a plurality of pixels, wherein, along the row direction, a number of pixels in each row in each pixel block is less than a total number of pixels of the display in a same row, and
         compensate the plurality of pixels in each of the pixel blocks in a plurality of frames using a sub-set of compensation data that comprises a plurality of compensation values, a number of the compensation values being less than or equal to a number of the pixels in the respective pixel block; and
      a data transmitter configured to transmit, in each one of the plurality of frames, a stream of display data comprising one of the plurality of sub-sets of the compensation data; and
   control logic operatively coupled to the display and the processor, comprising:
      a data receiver configured to receive the stream of display data from the data transmitter, and
      a post-processing module configured to provide control signals from the stream of display data for driving the display.

2. The system of claim 1, wherein:
   a number of the plurality of frames is less than or equal to the number of pixels in the respective pixel block.

3. The system of claim 2, wherein the pre-processing module is further configured to determine at least one pixel in the pixel block that is applied with the one or more compensation values in each frame, the at least one pixel including the one or more pixels corresponding to the one or more compensation values and not including pixels applied with corresponding compensation values in a previous frame.

4. The system of claim 3, wherein the pixel block comprises an array of pixels.

5. The system of claim 3, wherein:
   the number of the plurality of frames is equal to the number of the pixels in the respective pixel block; and
   each one of the plurality of sub-sets of compensation data comprises a compensation value for compensating a different one of the pixels in the pixel block.

6. The system of claim 5, wherein in each frame, only one pixel in the pixel block is applied with the compensation value.

7. The system of claim 5, wherein in each frame, two or more pixels connected with one another in the respective pixel block are applied with the compensation value.

8. The system of claim 7, wherein the two or more pixels form a portion of a row of the array, a portion of a column of the array, or a combination thereof.

9. The system of claim 5, wherein in at least one of the plurality of frames, one pixel in the pixel block is applied with the compensation value; and in at least another one of the plurality of frames, another pixel in the pixel block is applied with another compensation value.

10. The system of claim 1, wherein the pre-processing module is further configured to determine:
    a moving portion of the set of original display data; and
    one of the pre-processing module and the post-processing module is further configured to generate another set of compensation data for the moving portion of the set of original display data.

11. The system of claim 10, wherein in response to the pre-processing module determining the pre-processing module to generate the other set of compensation data for the moving portion,
    the pre-processing module is further configured to generate the other set of compensation data for the moving portion in each frame,
    the data transmitter is further configured to transmit a stream of display data comprising the other set of compensation data for the moving portion in each frame, and
    the post-processing module is further configured to provide the control signals based on the original display data, the set of compensation data, and the other set of compensation data.

12. The system of claim 10, wherein in response to the pre-processing module determining the post-processing module to generate the other set of compensation data for the moving portion, the post-processing module is further configured to:
generate the other set of compensation data for the moving portion in each frame; and
provide the control signals based on the original display data, the set of compensation data, and the other set of compensation data.

13. The system of claim 2, wherein the pre-processing module is further configured to determine the one of the plurality of sub-sets of compensation data for a frame based on another one of the plurality of sub-sets of compensation data for another frame immediately prior to the frame.

14. The system of claim 1, wherein the pre-processing module ja further configured to determine the sub-set of compensation data based on comparing the set of original display data with reference data in a grayscale look-up table.

15. The system of claim 1, wherein the still portion of the set of original display data is displayed by all of the plurality of pixels of the display and the set of compensation data is for compensating all of the plurality of pixels.

16. The system of claim 1, wherein along each of the row direction and the column direction, the number of pixels in each pixel block ranges from 2 to 4.

17. The system of claim 1, wherein
along the column direction, a number of pixels in each column in each pixel block is less than a total number of pixels of the display in a same column.

18. A method for compensating display data of an image having a plurality of pixels in a row direction and a column direction, comprising:
generating a set of original display data of the image;
determining a still portion of the set of original display data;
dividing pixels for displaying the still portion of the set of original display data into a plurality of pixel blocks, each pixel block having a plurality of pixels, wherein, along the row direction, a number of pixels in each row in each pixel block is less than a total number of pixels of the display in a same row; and
compensating the plurality of pixels in each of the pixel blocks in a plurality of frames using a plurality of compensation values, a number of the compensation values being less than or equal to a number of the pixels in the respective pixel block.

19. The method of claim 18, further comprising:
determining a number of the plurality of frames to be equal to a number of pixels in the respective pixel block.

20. The method of claim 19, wherein further comprising:
determining at least one pixel in the respective pixel block that is applied with the one or more compensation values in each frame, the at least one pixel including the one or more pixels corresponding to the one or more compensation values and not including pixels applied with corresponding compensation values in a previous frame.

21. A system for compensating display data of an image, comprising:
a display having a plurality of pixels arranged in a row direction and a column direction; and
a processor, comprising:
a graphics pipeline configured to generate a set of original display data of the image; and
a pre-processing module configured to:
determine a still portion and a moving portion of the set of original display data, a first plurality of pixels that display the still portion of the set of original display data, and a second plurality of pixels that display the moving portion of the set of original display data,
divide the first plurality of pixels into a plurality of pixel blocks, each pixel block having at least two pixels, wherein, along the row direction, a number of pixels in each row in each pixel block is less than a total number of pixels of the display in a same row,
determine a plurality of frames for compensating each of the pixel blocks,
determine a first set of compensation data that comprises a plurality of sub-sets of compensation data each having compensation values to be applied on at least one pixel in a respective pixel block in a single frame of the plurality of frames, a number of the compensation values being less than or equal to a number of pixels in the respective pixel block, and
determine a second set of compensation data having compensation values for all pixels in the second plurality of pixels in the single frame of the plurality of frames.

22. The system of claim 21, wherein
the number of compensation values for the respective pixel block is equal to a number of pixels in the respective pixel block, and is equal to a number of the plurality of frames.

23. A system for compensating display data of an image, comprising:
a display having a plurality of pixels arranged in a row direction and a column direction;
a processor, comprising:
a graphics pipeline configured to generate a set of original display data of the image,
a pre-processing module configured to:
determine a still portion and a moving portion of the set of original display data, a first plurality of pixels that display the still portion of the set of original display data, and a second plurality of pixels that display the moving portion of the set of original display data,
divide the first plurality of pixels into a plurality of pixel blocks, each pixel block having at least two pixels, wherein, along the row direction, a number of pixels in each row in each pixel block is less than a total number of pixels of the display in a same row,
determine a plurality of frames for compensating each of the pixel blocks, and
generate a first set of compensation data that comprises a plurality of sub-sets of compensation data each having compensation values to be applied on at least one pixel in the respective pixel block in a single frame of the plurality of frames, a number of the compensation values being less than or equal to a number of pixels in the respective pixel block; and
control logic operatively coupled to the processor and the display, comprising:
a post-processing module configured to generate a second set of compensation data having compensation values for all pixels in the second plurality of pixels in the single frame of the plurality of frames.

24. The system of claim 23, wherein
the number of compensation values for the respective pixel block is equal to a number of pixels in the respective pixel block, and is equal to a number of the plurality of frames.

* * * * *